(12) United States Patent
Sasaki

(10) Patent No.: US 10,553,299 B2
(45) Date of Patent: Feb. 4, 2020

(54) MAGNETIC DOMAIN WALL TYPE ANALOG MEMORY ELEMENT, MAGNETIC DOMAIN WALL TYPE ANALOG MEMORY, NONVOLATILE LOGIC CIRCUIT, AND MAGNETIC NEURO-ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/945,119

(22) Filed: Apr. 4, 2018

(65) Prior Publication Data

US 2018/0301199 A1   Oct. 18, 2018

(30) Foreign Application Priority Data

Apr. 14, 2017 (JP) .................................. 2017-080414
Dec. 19, 2017 (JP) .................................. 2017-243187

(51) Int. Cl.

| | |
|---|---|
| *G11C 19/08* | (2006.01) |
| *H01L 27/22* | (2006.01) |
| *H01L 43/08* | (2006.01) |
| *H01L 43/06* | (2006.01) |
| *G11C 11/16* | (2006.01) |
| *H01F 10/32* | (2006.01) |
| *H01L 43/10* | (2006.01) |
| *H03K 19/168* | (2006.01) |

(52) U.S. Cl.
CPC ........ *G11C 19/0841* (2013.01); *G11C 11/161* (2013.01); *G11C 11/1673* (2013.01); *H01L 27/226* (2013.01); *H01L 43/06* (2013.01); *H01L 43/08* (2013.01); *H03K 19/168* (2013.01); *H01F 10/3254* (2013.01); *H01L 43/10* (2013.01)

(58) Field of Classification Search
CPC .............. G11C 19/0841; G11C 11/161; G11C 11/1659
USPC ........................................................ 365/158
See application file for complete search history.

(56) References Cited

U.S. PATENT DOCUMENTS

| | | | |
|---|---|---|---|
| 9,489,618 B2 | 11/2016 | Roy et al. | |
| 2009/0296454 A1 | 12/2009 | Honda et al. | |
| 2010/0193889 A1* | 8/2010 | Nagahara | ............... B82Y 10/00 257/421 |

(Continued)

FOREIGN PATENT DOCUMENTS

| | | |
|---|---|---|
| JP | 4413603 B2 | 2/2010 |
| JP | 5206414 B2 | 6/2013 |

(Continued)

*Primary Examiner* — Anthan Tran
(74) *Attorney, Agent, or Firm* — Oliff PLC

(57) ABSTRACT

A magnetic domain wall type analog memory element includes: a magnetization fixed layer in which magnetization is oriented in a first direction; a non-magnetic layer provided in one surface of the magnetization fixed layer; a magnetic domain wall drive layer including a first area in which magnetization is oriented in the first direction, a second area in which magnetization is oriented in a second direction opposite to the first direction, and a magnetic domain wall formed as an interface between the areas and provided to sandwich the non-magnetic layer with respect to the magnetization fixed layer; and a current controller configured to cause a current to flow between the magnetization fixed layer and the second area at the time of reading.

17 Claims, 9 Drawing Sheets

(56) References Cited

U.S. PATENT DOCUMENTS

| | | |
|---|---|---|
| 2010/0237317 A1 | 9/2010 | Tsunoda |
| 2011/0116306 A1* | 5/2011 | Suzuki ................ H01L 27/228 |
| | | 365/158 |
| 2011/0129691 A1 | 6/2011 | Ishiwata et al. |
| 2012/0134199 A1* | 5/2012 | Zhu ........................ G11C 11/16 |
| | | 365/158 |
| 2014/0010004 A1 | 1/2014 | Suzuki |

FOREIGN PATENT DOCUMENTS

| | | |
|---|---|---|
| JP | 5486731 B2 | 5/2014 |
| JP | 2015-088669 A | 5/2015 |
| JP | 2016-004924 A | 1/2016 |
| WO | 2009/072213 A1 | 6/2009 |
| WO | 2009/101827 A1 | 8/2009 |

* cited by examiner

FIG. 3
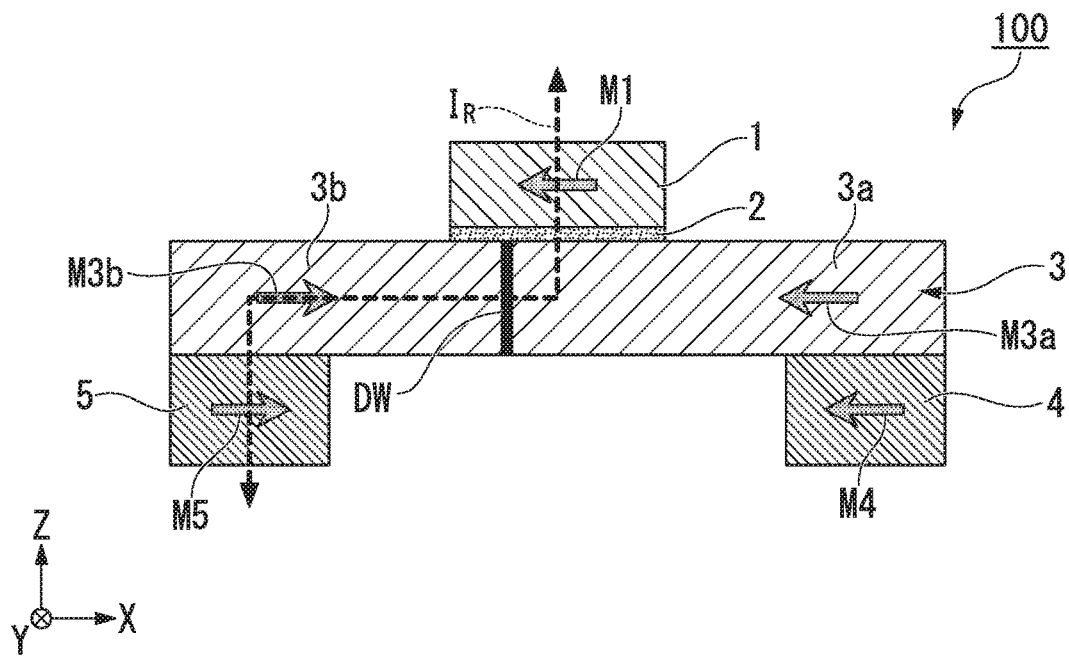
FIG. 4A
FIG. 4B
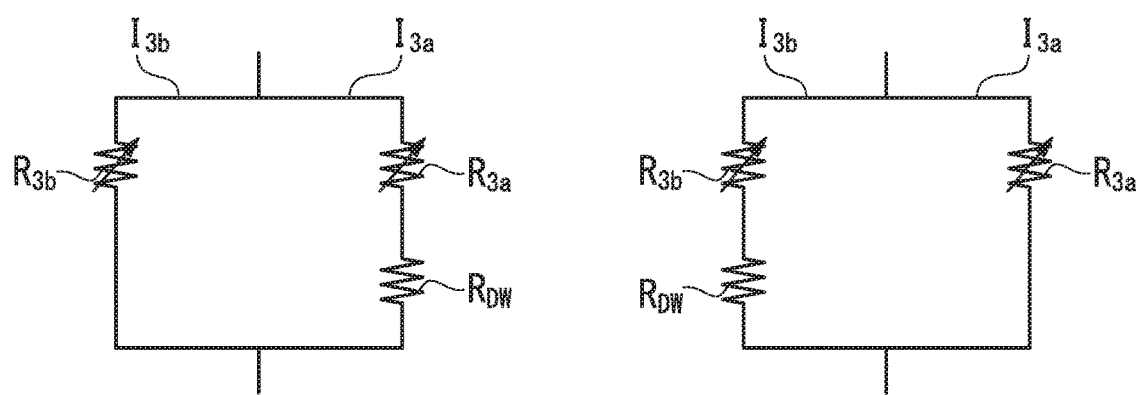

MAGNETIC DOMAIN WALL TYPE ANALOG MEMORY ELEMENT, MAGNETIC DOMAIN WALL TYPE ANALOG MEMORY, NONVOLATILE LOGIC CIRCUIT, AND MAGNETIC NEURO-ELEMENT

BACKGROUND OF THE INVENTION

Field of the Invention

The present invention relates to a magnetic domain wall type analog memory element, a magnetic domain wall type analog memory, a nonvolatile logic circuit, and a magnetic neuro-element.

Priority is claimed on Japanese Patent Application No. 2017-080414, filed Apr. 14, 2017, and Japanese Patent Application No. 2017-243187, filed Dec. 19, 2017 the content of which is incorporated herein by reference.

Description of Related Art

As next-generation nonvolatile memories replacing flash memories or the like whose miniaturization has reached a technical limitation, attention has been paid to, for example, resistance change type memories in which data is recorded using resistance change type elements such as a magnetroresistive random-access memory (MRAM), a resistance random-access memory (ReRAM), and a phase-change random-access memory (PCRAM).

As a method for increasing memory density (increasing memory capacity), there are a method for reducing a size of elements themselves constituting a memory as well as a method for converting a recording bit per element constituting a memory into multiple values, and various methods for obtaining multiple values have been proposed (for example, Patent Documents 1 to 3).

Also, Patent Document 4 or 5 discloses multiple value recording or analog recording using a magnetic domain wall type MRAM. In a magnetic domain wall type MRAM, data is written by causing a current to flow in an in-plane direction of a magnetic domain wall drive layer (magnetization free layer) and reversing a magnetization of a ferromagnetic film in a direction according to a direction of a write current. A magnetic domain wall of a magnetic domain wall drive layer is moved based on a spin transfer effect due to spin-polarized electrons.

On the other hand, at the time of reading, a magnetic domain wall type MRAM reads, as data, a change in resistance value of a magnetoresistance effect element which changes in accordance with a relative relationship between a magnetization direction of a magnetization fixed layer and an average magnetization direction of a central region of a magnetization recording layer. An average magnetization direction of a central region of a magnetization recording layer changes in accordance with a magnetization state (position of a magnetic domain wall) of a central region of a magnetization recording layer. In addition, Patent Document 5 discloses an example in which a magnetic domain wall type MRAM is used for a current read circuit of a memory array. One end of a magnetic domain wall drive layer is grounded and a current from the memory array is input to a fixed magnetization region of the other end thereof. The magnetic domain wall type MRAM functions as a current mode comparator by setting a magnetization direction of a magnetic domain wall layer to be parallel or antiparallel to the magnetization fixed layer using a direction of a current.

PATENT DOCUMENTS

[Patent Document 1] Japanese Unexamined Patent Application, First Publication No. 2015-88669
[Patent Document 2] PCT International Publication No. WO2009/072213
[Patent Document 3] Japanese Unexamined Patent Application, First Publication No. 2016-4924
[Patent Document 4] PCT International Publication No. WO2009/101827
[Patent Document 5] Specification of U.S. Pat. No. 9,489,618

SUMMARY OF THE INVENTION

Problems to be Solved by the Invention

However, Patent Document 4 only discloses that data is read using a change in resistance value of a magnetoresistance effect element and does not disclose a method for applying a read current. For this reason, a change in resistance value which changes in accordance with a magnetization state (position of a magnetic domain wall) is not linear and thus information written in a multiple value manner cannot be stably read in some cases. In Patent Document 5, a purpose thereof is not to store information, but to detect a current of a bit line and is only to provide a function equivalent to reading of a conventional binary memory.

Therefore, the present invention was made in view of the above circumstances, and an object of the present invention is to provide a magnetic domain wall type analog memory element, a magnetic domain wall type analog memory, a nonvolatile logic circuit, and a magnetic neuro-element which are capable of stably reading analog recording data.

Means for Solving the Problems

In order to achieve the above objects, the present invention provides the following means.

(1) A magnetic domain wall type analog memory element according to a first aspect includes: a magnetization fixed layer in which a magnetization is oriented in a first direction; a non-magnetic layer provided on one surface of the magnetization fixed layer; a magnetic domain wall drive layer including a first area in which a magnetization is oriented in the first direction, a second area in which a magnetization is oriented in a second direction opposite to the first direction, and a magnetic domain wall formed as an interface between the areas and provided to sandwich the non-magnetic layer between the magnetic domain wall and the magnetization fixed layer; and a current controller configured to cause a current to flow between the magnetization fixed layer and the second area at the time of reading.

(2) The magnetic domain wall type analog memory element according to the above aspect may further include: a first magnetization supplier configured to supply a magnetization oriented in the first direction to the magnetic domain wall drive layer and a second magnetization supplier configured to supply a magnetization oriented in the second direction to the magnetic domain wall drive layer, wherein at least one of the first magnetization supplier and the second magnetization supplier may be in contact with the magnetic domain wall drive layer and be a magnetization supply layer having a magnetization oriented in the first or second direction.

(3) The magnetic domain wall type analog memory element according to the above aspect may further include: a first magnetization supplier configured to supply a magnetization oriented in the first direction to the magnetic domain wall drive layer and a second magnetization supplier configured to supply a magnetization oriented in the second direction to the magnetic domain wall drive layer, wherein at least one of the first magnetization supplier and the second magnetization supplier may be electrically insulated from the magnetic domain wall drive layer and be a wiring extending in a direction in which the wiring intersects the magnetic domain wall drive layer.

(4) The magnetic domain wall type analog memory element according to the above aspect may further include: a first magnetization supplier configured to supply a magnetization oriented in the first direction to the magnetic domain wall drive layer and a second magnetization supplier configured to supply a magnetization oriented in the second direction to the magnetic domain wall drive layer, wherein at least one of the first magnetization supplier and the second magnetization supplier may be in contact with the magnetic domain wall drive layer and be a spin-orbit torque wiring extending in a direction in which the spin-orbit torque wiring intersects the magnetic domain wall drive layer.

(5) The magnetic domain wall type analog memory element according to the above aspect may further include: a first magnetization supplier configured to supply a magnetization oriented in the first direction to the magnetic domain wall drive layer and a second magnetization supplier configured to supply a magnetization oriented in the second direction to the magnetic domain wall drive layer, wherein at least one of the first magnetization supplier and the second magnetization supplier may be a voltage applier connected to the magnetic domain wall drive layer via an insulating layer.

(6) In the magnetic domain wall type analog memory element according to the above aspect, the current controller may be a potential controller configured to set a potential of the second area to be lower than a potential of the magnetization fixed layer at the time of reading.

(7) In the magnetic domain wall type analog memory element according to the above aspect, the current controller may be a rectifying element configured to control a flow direction of a current.

(8) A magnetic domain wall type analog memory according to a second aspect includes: a plurality of the magnetic domain wall type analog memory elements according to the above aspect.

(9) In a nonvolatile logic circuit according to a third aspect, a plurality of the magnetic domain wall type analog memory elements according to any one of the above aspects are arranged in an array fashion, a spin-transfer torque magnetoresistive random-access memory (STT-MRAM) is provided in or outside the array, a storage function and a logical function are provided, and the magnetic domain wall type analog memory element according to any one of the above aspects and the STT-MRAM are provided for the storage function.

(10) A magnetic neuro-element according to a fourth aspect includes: the magnetic domain wall type analog memory element according to the above aspect; and a current source having a control circuit configured to control a write current capable of sequentially moving a magnetic domain wall such that the magnetic domain wall stays at least once in each of a first storage, a second storage, and a third storage, wherein a magnetic domain wall drive layer has the first storage aligned in a longitudinal direction and the second storage and the third storage configured to sandwich the first storage.

Effects of the Invention

According to a magnetic domain wall type analog memory element of the present invention, data can be recorded with multiple values or in an analog manner and the data can be stably read.

BRIEF DESCRIPTION OF THE DRAWINGS

FIG. 3 is a diagram describing a read operation of the magnetic domain wall type analog memory element according to the first embodiment.

FIGS. 4A and 4B are diagrams schematically showing a part of a circuit at the time of reading data, FIG. 4A is a circuit diagram in a case in which a read current flows in a direction in which a magnetization with an orientation direction opposite to that of the magnetization of a magnetization fixed layer is present like in the magnetic domain wall type analog memory element according to the embodiment, and FIG. 4B is a circuit diagram in a case in which a read current flows in a direction in which a magnetization with an orientation direction that is the same as that of the magnetization of a magnetization fixed layer is present.

DETAILED DESCRIPTION OF THE INVENTION

Figure 1:
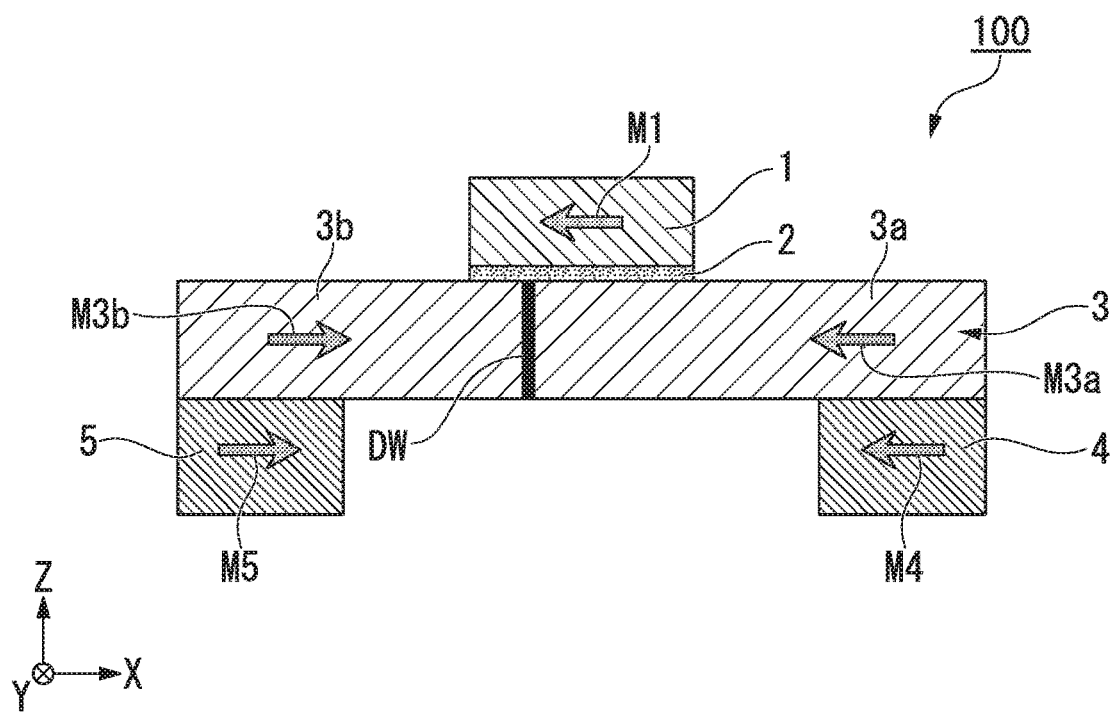
FIG. 1 is a cross-sectional schematic diagram illustrating an example of a magnetic domain wall type analog memory element according to a first embodiment.

Constitutions of embodiments will be described below with reference to the drawings. In the drawings used in the following description, the characteristic parts are shown in an enlarged manner in some cases for the sake of convenience to express the characteristics in an easily understandable way, and dimensional ratios or the like between each of constituent elements are not necessarily the same as the actual ones. Furthermore, materials, dimensions, and the like illustrated in the following description are merely examples, and the present invention is not limited thereto.

First Embodiment (Magnetic Domain Wall Type Analog Memory Element)

FIG. 1 is a cross-sectional schematic diagram illustrating an example of a magnetic domain wall type analog memory element according to a first embodiment. The magnetic domain wall type analog memory element illustrated in FIG. 1 includes a magnetization fixed layer 1, a non-magnetic layer 2, a magnetic domain wall drive layer 3, a first magnetization supply layer 4, a second magnetization supply layer 5, and a current controller (not shown).

In FIG. 1, the lamination direction of each of the layers, that is, a direction orthogonal to a main surface of each layer (direction orthogonal to the surface), is defined as a Z direction. Each layer is formed parallel to an XY plane orthogonal to the Z direction.

[Magnetization Fixed Layer]

The magnetization fixed layer 1 is a layer in which a magnetization M1 is oriented in a first direction and fixed. Here, such fixation of a magnetization means that a magnetization direction does not change (magnetization is fixed) before and after writing using a write current.

In the example illustrated in FIG. 1, the magnetization fixed layer 1 is an in-plane magnetized film in which the magnetization M1 has in-plane magnetic anisotropy (easy in-plane magnetization axis). The magnetization fixed layer 1 is not limited to such an in-plane magnetized film and may be a perpendicular magnetization film having perpendicular magnetic anisotropy (easy perpendicular magnetization axis).

When the magnetization fixed layer 1 is an in-plane magnetized film, the magnetization fixed layer 1 has a high magnetoresistance (MR) ratio, is hardly affected by spin transfer torque (STT) at the time of reading-in, and a read-out voltage is able to be increased. On the other hand, when it is desired to decrease the size of an element, it is desirable to use a perpendicular magnetization film having large magnetic anisotropy and a small demagnetizing field. Since a perpendicular magnetization film has high resistance to thermal disturbance, it is difficult to erase data.

A known material can be used for the magnetization fixed layer 1. For example, a metal selected from the group insisting of Cr, Mn, Co, Fe, and Ni and a metal containing at least one of such metals and exhibiting ferromagnetism can be used. Furthermore, an alloy containing such metals and at least one element of B, C, and N can also be used. To be specific, Co—Fe or Co—Fe—B may be exemplified.

Also, a Heusler alloy such as $Co_2FeSi$ can also be used for the magnetization fixed layer 1. A Heusler alloy contains an intermetallic compound having a chemical composition of $X_2YZ$, where X is a transition metal element or a noble metal element of a Co, Fe, Ni, or Cu group in the periodic table, Y is a transition metal of a Mn, V, Cr, or Ti group and can also take an element species of X, and Z is a typical element from Groups III to V. For example, $Co_2FeSi$, $Co_2MnSi$, $Co_2Mn_{1-a}Fe_aAl_bSi_{1-b}$ and the like may be exemplified.

The magnetization fixed layer 1 may have a synthetic structure constituted of an antiferromagnetic layer, a ferromagnetic layer, and a non-magnetic layer. In the synthetic structure, a magnetization direction of the magnetization fixed layer 1 is firmly held due to the antiferromagnetic layer. For this reason, the magnetization of the magnetization fixed layer 1 is less susceptible to external influences.

When the magnetization of the magnetization fixed layer 1 is oriented in the XY plane (magnetization fixed layer 1 is set as in-plane magnetized film), for example, it is desirable to use NiFe. On the other hand, when the magnetization of the magnetization fixed layer 1 is oriented in the Z direction (magnetization fixed layer 1 is set as a perpendicular magnetization film), for example, it is desirable to use a Co/Ni lamination film, a Co/Pt lamination film, or the like. For example, when the magnetization fixed layer 1 is made of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm), the magnetization fixed layer 1 is set as a perpendicular magnetization film.

[Non-Magnetic Layer]

The non-magnetic layer 2 is provided on one surface of the magnetization fixed layer 1. A magnetic domain wall type analog memory element 100 reads, as a change in resistance value, a change in magnetization state of the magnetic domain wall drive layer 3 with respect to the magnetization fixed layer 1 with the non-magnetic layer 2 therebetween. In other words, the magnetization fixed layer 1, the non-magnetic layer 2, and the magnetic domain wall drive layer 3 function as magnetoresistance effect elements, have structures similar to that of a tunneling magnetoresistance (TMR) element when the non-magnetic layer 2 is made of an insulator, and have structures similar to that of a giant magnetoresistance (GMR) element when the non-magnetic layer 2 is made of a metal.

As a material of the non-magnetic layer 2, a known material which can be used for a non-magnetic layer of a magnetoresistance effect element can be used. When the non-magnetic layer 2 is made of an insulator (in the case of a tunnel barrier layer), as a material thereof, $Al_2O_3$, $SiO_2$, MgO, $MgAl_2O_4$, $ZnAl_2O_4$, $MgGa_2O_4$, $ZnGa_2O_4$, $MgIn_2O_4$, $ZnIn_2O_4$, a multilayer film or a mixed composition film of such materials, and the like can be used. Furthermore, a material in which a part of Al, Si, and Mg is substituted with Zn, Be, or the like can also be used in addition to these. Among these, since MgO or $MgAl_2O_4$ is a material which can realize coherent tunneling, spin can be effectively injected. On the other hand, when the non-magnetic layer 2 is made of a metal, as a material thereof, Cu, Al, Ag, or the like can be used.

[Magnetic Domain Wall Drive Layer 3]

The magnetic domain wall drive layer 3 is a magnetization free layer made of a ferromagnetic material and a direction of magnetization therein can be reversed. The magnetic domain wall drive layer 3 has a first area 3a in which a magnetization $M_{3a}$ is oriented in a first direction that is the same as that of the magnetization fixed layer 1, a second area 3b in which a magnetization M3b is oriented in a second direction opposite to the first direction, and a magnetic domain wall DW forming an interface between the areas. The magnetization directions of the first area 3a and the second area 3b are opposite to each other and the magnetic domain wall DW is sandwiched therebetween. The magnetic domain wall DW moves depending on changes in compositional proportions in the magnetic domain wall drive layer 3 with respect to the first area 3a and the second area 3b.

As a material of the magnetic domain wall drive layer 3, a known material which can be used for a magnetization free layer of a magnetoresistance effect element can be used, and particularly a soft magnetic material can be applied. For example, a metal selected from the group consisting of Cr, Mn, Co, Fe, and Ni, an alloy containing at least one of these metals, an alloy containing these metals and at least one element from B, C, and N, or the like can be used. To be specific, Co—Fe, Co—Fe—B, or Ni—Fe may be exemplified as a material of the magnetic domain wall drive layer 3.

As a material of the magnetic domain wall drive layer 3, a material having a low saturation magnetization can also be used. For example, when a material having a low saturation magnetization such as MnGaAs or InFeAs is used, the magnetic domain wall DW of the magnetic domain wall drive layer 3 can be driven with a small current density. Furthermore, when such materials are used, a driving speed of the magnetic domain wall DW becomes slow and thus the magnetic domain wall type analog memory element is preferably used as an analog memory.

In a material having weak magnetic anisotropy such as NiFe, a driving speed of the magnetic domain wall DW is fast and the magnetic domain wall DW operates at a speed of 100 m/sec or more. In other words, the magnetic domain wall DW moves by a distance of 1 μm with a pulse of 10 nsec. Therefore, when the magnetic domain wall drive layer 3 is moved in an analog manner in the element, it is necessary to apply minute pulses using an expensive semiconductor circuit or to sufficiently lengthen a magnetic domain wall drive layer at the sacrifice of a degree of integration. On the other hand, in the case of a material in which a driving speed of the magnetic domain wall DW is slow, an analog memory can be formed even when a sufficiently long pulse current is applied or a length of the magnetic domain wall drive layer 3 is short.

It is desirable to use a perpendicular magnetization film of $Mn_3X$ (X=Ga, Ge) or a perpendicular magnetization film using a multilayer film of Co/Ni, Co/Pt, or the like for the magnetic domain wall drive layer 3. Such materials can be used to drive the magnetic domain wall DW even if a current density for driving a magnetic domain wall is small.

A length of the magnetic domain wall drive layer 3 extending in an X direction is preferably 60 nm or more. When such a length thereof is less than 60 nm, a single magnetic domain tends to be obtained and it is difficult to form the magnetic domain wall DW in the magnetic domain wall drive layer 3.

A thickness of the magnetic domain wall drive layer 3 is not particularly limited as long as the magnetic domain wall drive layer 3 functions as a magnetic domain wall drive layer, and for example, such a thickness thereof can be set to 2 to 60 nm. When the thickness of the magnetic domain wall drive layer 3 is 60 nm or more, a magnetic domain wall is highly likely to be formed in a lamination direction. Here, determination concerning whether such a magnetic domain wall is formed in the lamination direction depends on a balance with respect to shape anisotropy of the magnetic domain wall drive layer 3. When the thickness of the magnetic domain wall drive layer 3 is less than 60 nm, it is thought unlikely that the magnetic domain wall DW will be able to be formed.

The magnetic domain wall drive layer 3 may have a magnetic domain wall pinning portion configured to stop the movement of the magnetic domain wall DW in a lateral surface of the layer. For example, when unevenness, grooves, bulges, constricted portions, cutouts or the like are provided at a position of the magnetic domain wall drive layer 3 at which it is desired to stop movement of the magnetic domain wall DW, the movement of the magnetic domain wall can be stopped (pinned). When a magnetic domain wall pinning portion is provided, a constitution in which the magnetic domain wall does not move any further unless a current equal to or larger than a threshold value flows can be adopted and thus it is easy to convert an output signal into multiple values instead of an analog manner.

For example, a magnetic domain wall pinning portion at predetermined intervals is formed so that the magnetic domain wall DW can be more stably held, stable multiple value recording can be performed, and an output signal more stably converted into multiple values can be read.

[First Magnetization Supply Layer and Second Magnetization Supply Layer]

The first magnetization supply layer 4 and the second magnetization supply layer 5 are aspects of magnetization suppliers configured to supply a magnetization to the magnetic domain wall drive layer 3. When a write current flows between the magnetization fixed layer 1 and the first magnetization supply layer 4 or the second magnetization supply layer 5, a magnetization is supplied from the first magnetization supply layer 4 or the second magnetization supply layer 5 to the magnetic domain wall drive layer 3.

The first magnetization supply layer 4 and the second magnetization supply layer 5 are both layers (ferromagnetic layers) made of a ferromagnetic material whose magnetization is fixed. A magnetization M4 of the first magnetization supply layer 4 is oriented in the same direction as the magnetization $M_{3a}$ of the first area 3a of the magnetic domain wall drive layer 3 with which the first magnetization supply layer 4 is in contact. In other words, the magnetization M4 of the first magnetization supply layer 4 is oriented in the same direction as the magnetization M1 of the magnetization fixed layer 1. On the other hand, a magnetization M5 of the second magnetization supply layer 5 is oriented in the same direction as the magnetization M3b of the second area 3b of the magnetic domain wall drive layer 3 with which the second magnetization supply layer 5 is in contact. In other words, the magnetization M5 of the second magnetization supply layer 5 is oriented in an opposite direction to the magnetization M1 of the magnetization fixed layer 1.

In FIG. 1, the first magnetization supply layer 4 and the second magnetization supply layer 5 are arranged on a side opposite to the magnetization fixed layer 1 with respect to the magnetic domain wall drive layer 3. The first magnetization supply layer 4 and the second magnetization supply layer 5 may be arranged on the same surface side as the magnetization fixed layer 1 with respect to the magnetic domain wall drive layer 3.

When the first magnetization supply layer 4 and the second magnetization supply layer 5 are arranged on the side opposite to the magnetization fixed layer 1 with respect to the magnetic domain wall drive layer 3, an influence of the magnetization M5 of the second magnetization supply layer 5 and the magnetization M4 of the first magnetization supply layer 4 with respect to the magnetization M1 of the magnetization fixed layer 1 can be reduced. On the other hand, when the first magnetization supply layer 4 and the second magnetization supply layer 5 are arranged on the same surface side as the magnetization fixed layer 1 with respect to the magnetic domain wall drive layer 3, it is unnecessary to make heights of surfaces of the first magnetization supply layer 4 and the second magnetization supply layer 5 on which the magnetic domain wall drive layer 3 is formed coincide with each other, and thus the manufacturing of the magnetic domain wall type analog memory element 100 is facilitated.

Also, in principle, magnetization directions of portions of the magnetic domain wall drive layer 3 with which the first magnetization supply layer 4 and the second magnetization supply layer 5 are in contact are not rewritten. This is because the first magnetization supply layer 4 and the second magnetization supply layer 5 and the magnetic domain wall drive layer 3 are electrically coupled and stabilized. For this reason, when the first magnetization supply layer 4 and the second magnetization supply layer 5 are used as magnetization suppliers, in principle, the magnetic domain wall DW does not move outward (in the X direction) from portions thereof in contact with the first magnetization supply layer 4 and the second magnetization supply layer 5 even when the magnetic domain wall DW is moved. It is possible to prevent from obtaining a single magnetic domain and prevent losing of the magnetic domain wall DW during operation by restricting a movable range of the magnetic domain wall DW.

A material that is the same as that of the magnetization fixed layer 1 can be used for the first magnetization supply layer 4 and the second magnetization supply layer 5. Orientation directions of the magnetization M4 of the first magnetization supply layer 4 and the magnetization M5 of the second magnetization supply layer 5 are set in advance using an external magnetic field or the like.

[Current Controller]

The current controller is a controller configured to perform control so that a current flows from the magnetization fixed layer 1 toward the second area 3b of the magnetic domain wall drive layer 3 at the time of reading.

Examples of such current controllers include a potential controller configured to control potentials of the magnetization fixed layer 1, the first area 3a, and the second area 3b at the time of reading. For example, the magnetization fixed layer 1 and the first area 3a may be set to have the same potential and a potential of the second area 3b may be set to be lower than a potential of the magnetization fixed layer 1. When setting is performed in this way, a current flows from the magnetization fixed layer 1 toward the second area 3b at the time of reading.

Also, besides this, a rectifying element such as a diode may be used as the current controller. A diode or the like may be used so that a current is controlled to flow from the magnetization fixed layer 1 toward the second area 3b at the time of reading.

(Operation of Magnetic Domain Wall Type Analog Memory Element)

An operation principle of writing and reading data of the magnetic domain wall type analog memory element according to the embodiment will be described below.

[Write Operation]

First, a write operation will be described. In the magnetic domain wall type analog memory element, writing is performed using magnetoresistance effects such as a giant magneto resistance (GMR) effect or a tunnel magneto resistance (TMR) effect. Such magnetoresistance effects are recorded by associating resistance value states occurring due to, for example, magnetization directions of two ferromagnetic layers laminated with a non-magnetic layer therebetween being parallel or anti-parallel to each other with "0" or "1." Since such magnetization directions do not change unless an external force is applied, data is recorded in a nonvolatile fashion.

At the time of writing, data is recorded by changing orientation directions of the magnetizations $M_{3a}$ and M3b in the magnetic domain wall drive layer 3 with respect to the magnetization M1 of the magnetization fixed layer 1. For this reason, at the time of writing, a magnetization state of the magnetic domain wall drive layer 3 is rewritten. The magnetic domain wall drive layer 3 also rewrites a magnetization state thereof by causing a write current to flow from one end of the magnetic domain wall drive layer 3 toward the other end thereof. When a current equal to or larger than a threshold value flows in a direction of passing through the magnetic domain wall DW (X direction), a spin polarization current is generated in a domain (magnetic domain) of the magnetic domain wall drive layer 3 and the magnetic domain wall DW in the magnetic domain wall drive layer 3 moves in a direction in which conduction electrons flow.

Figure 2A:
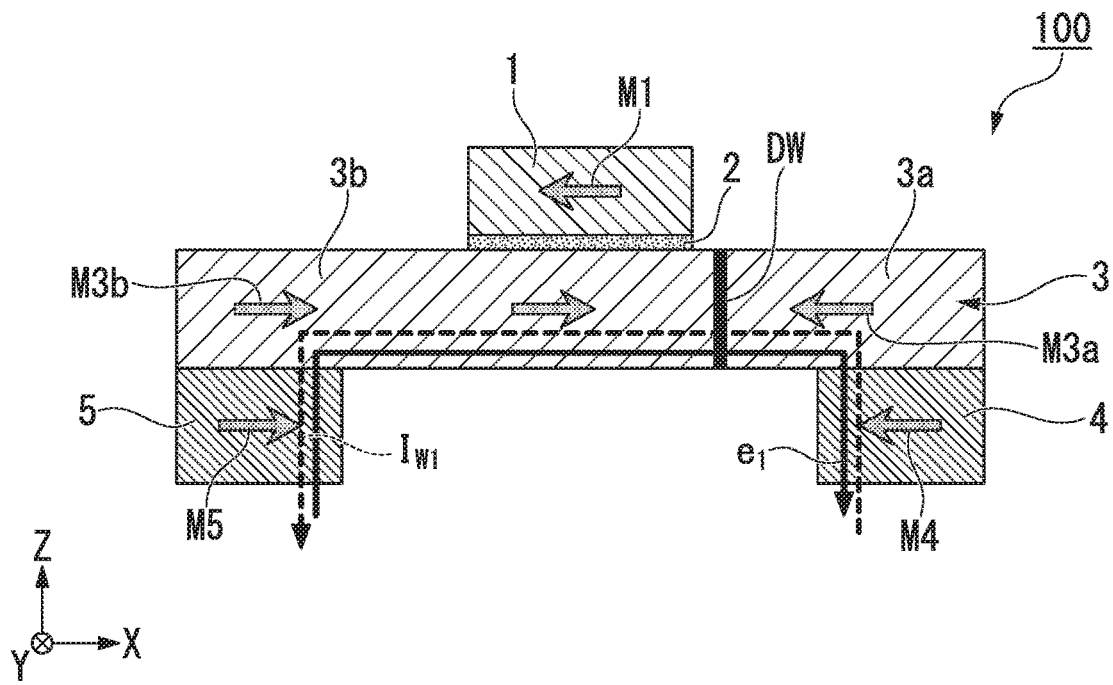
FIGS. 2A and 2B are diagrams describing a write operation of the magnetic domain wall type analog memory element according to the first embodiment.
Figure 2B:
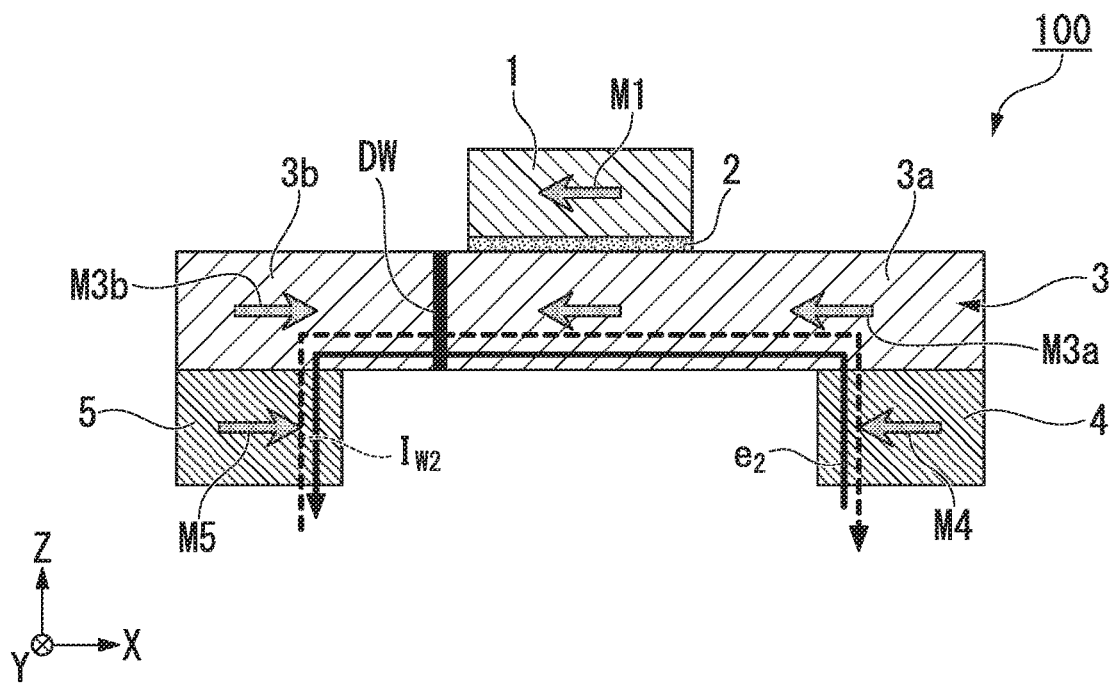

FIGS. 2A and 2B are diagrams describing a write operation of the magnetic domain wall type analog memory element 100 according to the embodiment.

For example, when a current $I_{W1}$ flows from the first magnetization supply layer 4 to the second magnetization supply layer 5 via the magnetic domain wall drive layer 3 in the direction indicated by a dotted line in FIG. 2A, conduction electrons $e_1$ flow in a direction indicated by a solid line opposite to a direction of the current $I_{W1}$. When the conduction electrons $e_1$ enter the magnetic domain wall drive layer 3 from the second magnetization supply layer 5, the conduction electrons $e_1$ become spin-polarized electrons corresponding to a direction of the magnetization M3b of a domain of the second magnetization supply layer 5 and the magnetic domain wall drive layer 3 magnetically coupled to the second magnetization supply layer 5. When such spin-polarized electrons reach the magnetic domain wall DW, the spin of the spin-polarized electrons in the magnetic domain wall DW causes a spin transfer in the magnetic domain wall DW and the magnetic domain wall DW moves in a direction that is the same as a direction in which the conduction electrons $e_1$ flow. In other words, the magnetic domain wall DW moves from the left toward the right in FIG. 2A.

Similarly, when a current $I_{W2}$ is caused to flow from the second magnetization supply layer 5 to the first magnetization supply layer 4 via the magnetic domain wall drive layer 3 in the direction indicated by a dotted line in FIG. 2B, conduction electrons $e_2$ flow in a direction indicated by a solid line opposite to a direction of the current $I_{W2}$. When the conduction electrons $e_2$ enter the magnetic domain wall drive layer 3 from the first magnetization supply layer 4, the conduction electrons $e_2$ become a spin polarization current corresponding to a direction of the magnetization $M_{3a}$ of a domain of the first magnetization supply layer 4 and the magnetic domain wall drive layer 3 magnetically coupled to the first magnetization supply layer 4. When such spin-polarized electrons reach the magnetic domain wall DW, the spin of the spin-polarized electrons in the magnetic domain wall DW causes a spin transfer in the magnetic domain wall DW and the magnetic domain wall DW moves in a direction that is the same as a direction in which the conduction electrons $e_2$ flow. In other words, the magnetic domain wall DW moves from the right toward the left in FIG. 2B.

When a position of the magnetic domain wall DW varies, a magnetization state of a portion of the magnetic domain wall drive layer 3 in contact with the magnetization fixed layer 1 changes. For example, data can be recorded in binary by setting a magnetization state of the magnetic domain wall drive layer 3 in contact with the magnetization fixed layer 1 being antiparallel to the magnetization M1 of the magnetization fixed layer 1 as illustrated in FIG. 2A and a magnetization state of a portion of the magnetic domain wall drive layer 3 in contact with the magnetization fixed layer 1 being parallel to the magnetization M1 of the magnetization fixed layer 1 as illustrated in FIG. 2A to "0" and "1," respectively. Furthermore, when there is the magnetic domain wall DW in a portion of the magnetic domain wall drive layer 3 in contact with the magnetization fixed layer 1, data can be recorded with multiple values by providing a plurality of threshold values to a resistance value varying when a proportion of the constitution between the magnetization $M_{3a}$ and the magnetization M3*b* in the magnetic domain wall drive layer 3 changes.

Also, an amount of movement (movement distance) of the magnetic domain wall DW can be variably controlled by adjusting a magnitude of a write current and a time. In the magnitude of the write current and the time, for example, the amount of movement (movement distance) of the magnetic domain wall DW may be set using the number of pulses or a pulse width.

[Read Operation]

A read operation of data will be described below. FIG. 3 is a diagram describing a read operation of the magnetic domain wall type analog memory element 100 according to the embodiment.

As illustrated in FIG. 3, at the time of reading data, a current $I_R$ flows between the magnetization fixed layer 1 and the second area 3*b* of the magnetic domain wall drive layer 3. A flow direction of the current $I_R$ is controlled by the current controller. The current $I_R$ is caused to flow in a direction in which the magnetization M3*b* with an orientation direction opposite to that of the magnetization M1 of the magnetization fixed layer 1 is present so that a change in resistance value of the magnetic domain wall type analog memory element 100 has a linear shape and thus data can be more accurately read with multiple values.

The magnetization $M_{3a}$ of the first area 3*a* in the magnetic domain wall drive layer 3 is oriented parallel to the magnetization M1 of the magnetization fixed layer 1. On the other hand, the magnetization M3*b* of the second area 3*b* in the magnetic domain wall drive layer 3 is oriented antiparallel to the magnetization M1 of the magnetization fixed layer 1. In other words, an interface between the magnetization fixed layer 1 and the first area 3*a* has low resistance and an interface between the magnetization fixed layer 1 and the second area 3*b* has high resistance.

FIGS. 4A and 4B are diagrams schematically showing a part of a circuit at the time of reading data, FIG. 4A is a circuit diagram in a case in which a read current $I_R$ flows in a direction in which the magnetization M3*b* with an orientation direction opposite to that of the magnetization M1 of the magnetization fixed layer 1 is present like in the magnetic domain wall type analog memory element according to the embodiment, and FIG. 4B is a circuit diagram in a case in which the read current $I_R$ flows in a direction in which the magnetization $M_{3a}$ with an orientation direction that is the same as that of the magnetization M1 of the magnetization fixed layer 1 is present.

When the read current $I_R$ is caused to flow toward the second area 3*b* in which the magnetization M3*b* with an orientation direction opposite to that of the magnetization M1 of the magnetization fixed layer 1 is present, as illustrated in FIG. 4A, a parallel circuit having a current path $I_{3a}$ with a resistor $R_{3a}$ in an interface between the magnetization fixed layer 1 and the first area 3*a* and a current path $I_{3b}$ with a resistor $R_{3b}$ in an interface between the magnetization fixed layer 1 and the second area 3*b* is formed. The resistor $R_{3a}$ at the interface between the magnetization fixed layer 1 and the first area 3*a* and the resistor $R_{3b}$ at the interface between the magnetization fixed layer 1 and the second area 3*b* can be regarded as variable resistances which vary depending on a position of the magnetic domain wall DW in the magnetic domain wall drive layer 3 in contact with the magnetization fixed layer 1.

Also, since the read current $I_R$ finally flows toward the second area 3*b*, a current flowing at the interface between the magnetization fixed layer 1 and the first area 3*a* passes through the magnetic domain wall DW between the first area 3*a* and the second area 3*b*. In other words, a resistor $R_{DW}$ at the interface of the magnetic domain wall DW is superimposed on the current path $I_{3a}$. Since the resistance state of the magnetic domain wall DW does not vary greatly due to only a variation in position thereof, the resistor $R_{DW}$ can be regarded as a fixed resistance.

On the other hand, also in a case in which the read current $I_R$ is caused to flow toward the first area 3*a* in which the magnetization $M_{3a}$ with an orientation direction that is the same as that of the magnetization M1 of the magnetization fixed layer 1 is present, as illustrated in FIG. 4B, a parallel circuit having the current path $I_{3a}$ with the resistor $R_{3a}$ at the interface between the magnetization fixed layer 1 and the first area 3*a* and the current path $I_{3b}$ with the resistor $R_{3b}$ at the interface between the magnetization fixed layer 1 and the second area 3*b* is formed. On the other hand, since the read current $I_R$ finally flows toward the first area 3*a*, a current flowing at the interface between the magnetization fixed layer 1 and the second area 3*b* needs to pass through the magnetic domain wall DW between the first area 3*a* and the second area 3*b*. In other words, the resistor $R_{DW}$ at the interface of the magnetic domain wall DW is superimposed on the current path $I_{3b}$.

Here, as described above, the resistor $R_{3a}$ at the interface between the magnetization fixed layer 1 and the first area 3*a* has a lower resistance than the resistor $R_{3b}$ at the interface between the magnetization fixed layer 1 and the second area 3*b*. As illustrated in FIG. 4B, when the resistor $R_{DW}$ at the interface of the magnetic domain wall DW is present in the current path $I_{3b}$ in which the resistor $R_{3b}$ with high resistance is present, the total resistance of the current path $I_{3b}$ increases and most of a read current flows through the current path $I_{3a}$. For this reason, when the read current $I_R$ is caused to flow toward the first area 3*a* in which the magnetization $M_{3a}$ with an orientation direction that is the same as that of the magnetization M1 of the magnetization fixed layer 1 is present, a change in resistance value of the resistor $R_{3a}$ at the interface between the magnetization fixed layer 1 and the first area 3*a* is mainly read as a change in resistance value of the magnetic domain wall type analog memory element 100 and a change in resistance value of the resistor $R_{3b}$ at the interface between the magnetization fixed layer 1 and the second area 3*b* does not greatly contribute.

On the other hand, as illustrated in FIG. 4, when the resistor $R_{DW}$ at the interface of the magnetic domain wall DW is present in the current path $I_{3a}$ in which the resistor $R_{3a}$ with low resistance is present, the total resistance of the current path $I_{3a}$ increases and a distribution ratio of a read current flowing through the current path $I_{3a}$ and a read current flowing through the current path $I_{3b}$ is averaged. For this reason, when the read current $I_R$ is caused to flow toward the second area 3*b* in which the magnetization M3*b* with an orientation direction opposite to that of the magnetization M1 of the magnetization fixed layer 1 is present, a read current flows to both of the current path $I_{3a}$ and the current path $I_{3b}$, and a change in resistance value obtained by superimposing a change in resistance value of the resistor $R_{3a}$ between the magnetization fixed layer 1 and the first area 3a and a change in resistance value of the resistor $R_{3b}$ between the magnetization fixed layer 1 and the second area 3b is read as a change in resistance value of the magnetic domain wall type analog memory element 100.

A change in resistance value of two resistor $R_{3a}$ and $R_{3b}$ (variable resistors) in the circuit can be read as a change in resistance value of the domain wall type analog memory element 100 by controlling a flow direction of the current $I_R$ at the time of reading in this way using the current controller and thus data can be read more accurately.

It is necessary to consider a spatial distribution of a current at the time of reading data. In FIG. 3, a resistance between the magnetization fixed layer 1 and the magnetic domain wall drive layer 3 differs depending on magnetization directions of the magnetization fixed layer 1 and the magnetic domain wall drive layer 3. In FIG. 3, the orientations of the first area 3a and the magnetization fixed layer 1 are parallel to each other and thus the resistance thereof is low. Orientations of the second area 3b and the magnetization fixed layer 1 are antiparallel and thus the resistance thereof is high. In other words, a current easily flows into the first area 3a. A current flowing through the first area 3a flows to the second magnetization supply layer 5 via the second area 3b. However, since a current flowing through the first area 3a flows to the first magnetization supply layer 4 as it is when a current flows from the magnetization fixed layer 1 to the first magnetization supply layer 4, a current flowing from the magnetization fixed layer 1 with high resistance to the second magnetization supply layer 5 decreases and a high resistance region cannot be fully utilized as a resistor of the path. Therefore, the linearity of the read-in resistance with respect to the movement of a magnetic domain wall in a case in which a current flows from the magnetization fixed layer 1 to the first magnetization supply layer 4 is higher than that in a case in which a current flows from the magnetization fixed layer 1 to the second magnetization supply layer 5.

Note that a part of a current $I_R$ at the time of reading flows in a direction of passing through the magnetic domain wall DW (X direction). At this time, the magnetic domain wall DW moves and it is also thought that a written state changes at the time of reading, but a current $I_R$ applied at the time of reading is smaller than currents $I_{W1}$ and $I_{W2}$ applied at the time of writing. For this reason, the movement of the magnetic domain wall DW can be restricted by adjusting a current $I_R$ applied at the time of reading.

As described above, in the magnetic domain wall type analog memory element 100 according to the first embodiment, data can be recorded with multiple values by adjusting a proportion of the constitution between the first area 3a and the second area 3b in a portion of the magnetic domain wall drive layer 3 in contact with the magnetization fixed layer 1 at the time of writing and moving the magnetic domain wall DW. Furthermore, a flow direction of the current $I_R$ at the time of reading is controlled using the current controller so that a change in resistance value of the magnetic domain wall type analog memory element 100 is linear due to the magnetic domain wall driving and thus an analog value can be measured more accurately.

(Other Configurations)

A magnetic coupling layer may be provided between the magnetic domain wall drive layer 3 and the non-magnetic layer 2. The magnetic coupling layer is a layer through which a magnetization state of the magnetic domain wall drive layer 3 is transferred. A main function of the magnetic domain wall drive layer 3 is a layer configured to drive a magnetic domain wall and it is not always possible to select a material suitable for the magnetoresistance effect generated via the magnetization fixed layer 1 and the non-magnetic layer 2. Generally, it is known that, in order to generate a coherent tunneling effect using the non-magnetic layer 2, a ferromagnetic material with a body-centered cubic (BCC) structure is good for the magnetization fixed layer 1 or the magnetic coupling layer. Particularly, it is known that a large output can be obtained when a material with a composition of Co—Fe—B is formed through sputtering as a material of the magnetization fixed layer 1 or the magnetic coupling layer.

Also, a thickness of a portion of the magnetic domain wall drive layer 3 superimposed on the magnetization fixed layer 1 in plan view may be thicker than the other portions. When the magnetic domain wall DW moves under the non-magnetic layer 2, a cross-sectional area of the magnetic domain wall DW increases so that a current density decreases and a moving speed of the magnetic domain wall DW decreases. When the moving speed of the magnetic domain wall DW decreases, a proportion of the constitution between the first area 3a and the second area 3b in a portion of the magnetic domain wall drive layer 3 in contact with the magnetization fixed layer 1 is easily controlled and output data is easily read as an analog value.

Such a structure can be prepared by forming the magnetic domain wall drive layer 3, the non-magnetic layer 2, and the magnetization fixed layer 1 through continuous film formation and removing unnecessary portions. When continuous film formation is performed, the bonding between layers to be bonded becomes stronger and magnetic coupling and an output with higher efficiency can be obtained.

Also, besides this, a constitution equivalent to that used for the magnetoresistance effect element can be used. For example, each layer may be constituted of a plurality of layers or may include other layers such as an antiferromagnetic layer configured to fix a magnetization direction of the magnetization fixed layer 1.

Second Embodiment

Figure 5:
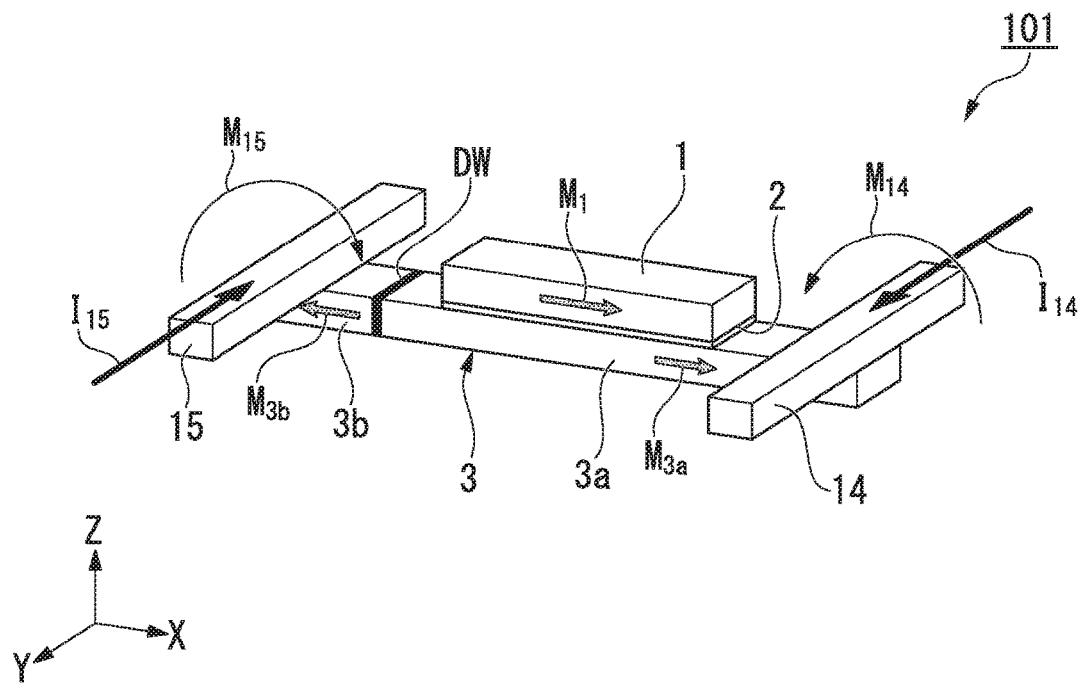
FIG. 5 is a schematic perspective view showing a magnetic domain wall type analog memory element according to a second embodiment.

FIG. 5 is a schematic perspective view showing a magnetic domain wall type analog memory element 101 according to a second embodiment. The magnetic domain wall type analog memory element 101 according to the second embodiment and the magnetic domain wall type analog memory element 100 according to the first embodiment differ in that the magnetic domain wall type analog memory element 101 according to the second embodiment includes different magnetization suppliers. Other constitutions of the magnetic domain wall type analog memory element 101 according to the second embodiment are the same as those of the magnetic domain wall type analog memory element 100 according to the first embodiment and constituent elements of the magnetic domain wall type analog memory element 101 according to the second embodiment that are the same as those of the magnetic domain wall type analog memory element 100 according to the first embodiment will be denoted with the same reference numerals.

In the magnetic domain wall type analog memory element 101 according to the second embodiment, the magnetization suppliers are a first wiring 14 and a second wiring 15 which are electrically insulated from a magnetic domain wall drive layer 3 and extend in a direction in which the first wiring 14 and the second wiring 15 intersect the magnetic domain wall drive layer 3.

Since the magnetization suppliers of the magnetic domain wall type analog memory element 101 according to the second embodiment are different from those of the magnetic domain wall type analog memory element 100 according to the first embodiment, an operation at the time of writing is different. When writing is performed on the magnetic domain wall type analog memory element 101, currents $I_{14}$ and $I_{15}$ are caused to flow through at least one of the first wiring 14 and the second wiring 15. When the currents $I_{14}$ and $I_{15}$ flow through the first wiring 14 and the second wiring 15, magnetic fields $M_{14}$ and $M_{15}$ are generated in the first wiring 14 and the second wiring 15 based on the Ampere's law.

Orientations of the current $I_{14}$ flowing through the first wiring 14 and the current $I_{15}$ flowing through the second wiring 15 are set to be opposite. Directions of the magnetic fields $M_{14}$ and $M_{15}$ generated around the wirings are opposite by setting the directions of the currents to be opposite. The magnetic field $M_{14}$ produced by the first wiring 14 provides the magnetic field $M_{14}$ of +X to the magnetic domain wall drive layer 3 and the magnetic field $M_{15}$ produced by the second wiring 15 provides the magnetic field $M_{15}$ of −X to the magnetic domain wall drive layer 3. In other words, a proportion of the constitution between the first area 3a and the second area 3b of the magnetic domain wall drive layer 3 is changed by flowing the currents through the first wiring 14 and the second wiring 15 and a position of the magnetic domain wall DW is moved so that data can be recorded with multiple values.

At the time of reading data, like in the magnetic domain wall type analog memory element 100 according to the first embodiment, a flow direction of a current is controlled between a magnetization fixed layer 1 and a second area 3b of a magnetic domain wall drive layer 3 so that data can be accurately read.

A material used for the first wiring 14 and the second wiring 15 is not particularly limited as long as the material has excellent conductivity. For example, gold, silver, copper, aluminum, or the like can be used.

Figure 6:
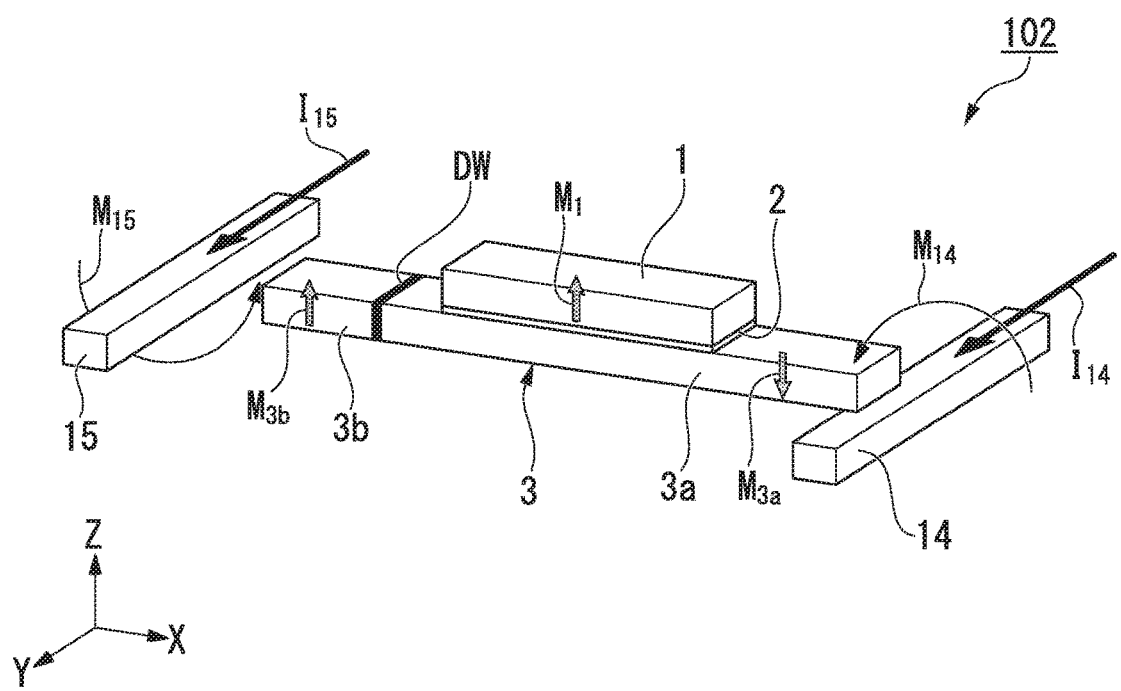
FIG. 6 is a schematic perspective view illustrating another example of the magnetic domain wall type analog memory element according to the second embodiment.

Also, when magnetization directions of the magnetization fixed layer 1 and the magnetic domain wall drive layer 3 are oriented in a Z direction like in a magnetic domain wall type analog memory element 102 illustrated in FIG. 6, a position of the magnetic domain wall DW can be moved by adjusting a positional relationship between the first wiring 14 and the second wiring 15 and flowing directions of the currents $I_{14}$ and $I_{15}$.

Third Embodiment

Figure 7:
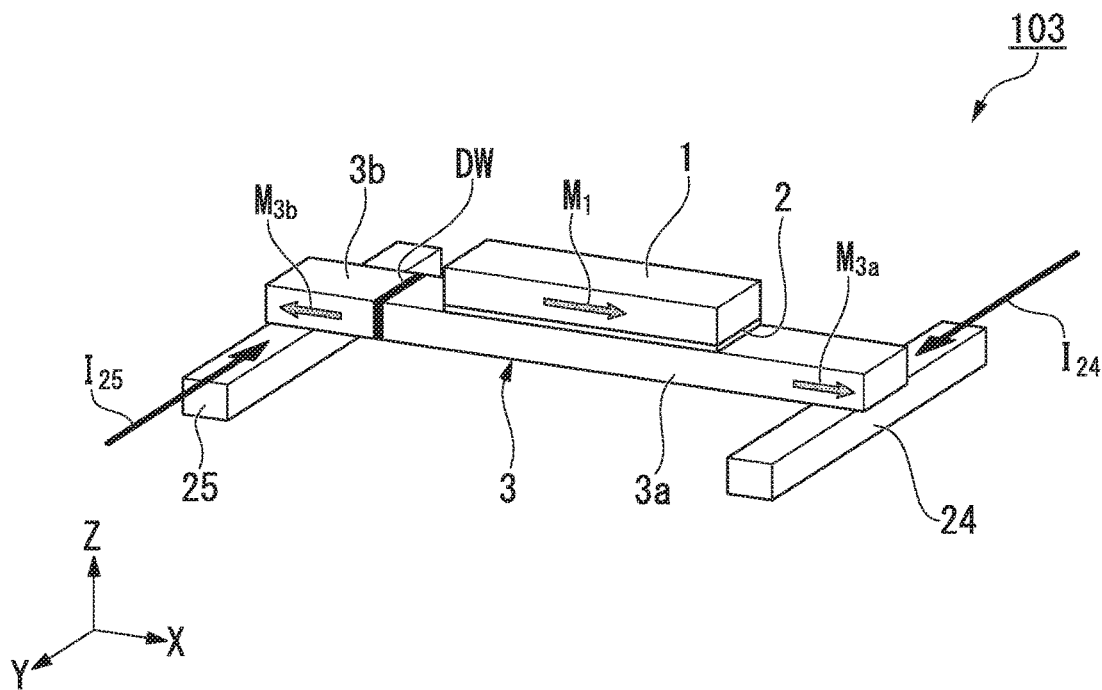
FIG. 7 is a schematic perspective view showing a magnetic domain wall type analog memory element according to a third embodiment.

FIG. 7 is a schematic perspective view showing a magnetic domain wall type analog memory element 103 according to a third embodiment. The magnetic domain wall type analog memory element 103 according to the third embodiment and the magnetic domain wall type analog memory element 100 according to the first embodiment differ in that the magnetic domain wall type analog memory element 103 according to the third embodiment includes different magnetization suppliers. Other constitutions of the magnetic domain wall type analog memory element 103 according to the third embodiment are the same as those of the magnetic domain wall type analog memory element 100 according to the first embodiment and constituent elements of the magnetic domain wall type analog memory element 103 according to the third embodiment that are the same as those of the magnetic domain wall type analog memory element 100 according to the first embodiment will be denoted with the same reference numerals.

In the magnetic domain wall type analog memory element 103 according to the third embodiment, the magnetization suppliers are a first spin-orbit torque wiring 24 and a second spin-orbit torque wiring 25 which are in contact with a magnetic domain wall drive layer 3 and extend in a direction in which the first spin-orbit torque wiring 24 and the second spin-orbit torque wiring 25 intersect the magnetic domain wall drive layer 3. Hereinafter, the first spin-orbit torque wiring 24 and the second spin-orbit torque wiring 25 are collectively referred to as spin-orbit torque in some cases.

Since the magnetization suppliers of the magnetic domain wall type analog memory element 103 according to the third embodiment are different from those of the magnetic domain wall type analog memory element 100 according to the first embodiment, an operation at the time of writing is different. When writing is performed on the magnetic domain wall type analog memory element 103, currents $I_{24}$ and $I_{25}$ are caused to flow through at least one of the first spin-orbit torque wiring 24 and the second spin-orbit torque wiring 25.

When the currents $I_{24}$ and $I_{25}$ flow through the first spin-orbit torque wiring 24 and the second spin-orbit torque wiring 25, spins derived from a spin-orbit interaction are supplied to the magnetic domain wall drive layer 3. The spins derived from the spin-orbit interaction are generated based on a spin Hall effect caused due to currents flowing through spin-orbit torque wirings and an interface Rashba effect caused between different element interfaces.

A spin Hall effect is a phenomenon in which, when a current is caused to flow through a material, a pure spin current is induced in a direction orthogonal to a direction of the current on the basis of a spin-orbit interaction. When a current is caused to flow in an extending in a direction of a spin-orbit torque wiring, a first spin oriented in one direction and a second spin oriented in a direction opposite thereto are each bent in a direction orthogonal to that of the current. A normal Hall effect and a spin Hall effect are common in that a direction of movement of moving charges (electrons) is bent, but greatly differ in that, in a normal Hall effect, charged particles moving in a magnetic field undergo a Lorentz force and thus a direction of movement thereof is bent, whereas in a spin Hall effect, a direction of movement thereof is bent only by the movement of electrons (only by flowing current) even though there is no magnetic field.

In a nonmagnetic material (material which is not a ferromagnetic material), the number of electrons in the first spin is equal to the number of electrons in the second spin. For this reason, for example, in FIG. 7, the number of electrons in the first spin directed upward is equal to the number of electrons in the second spin directed downward. When a flow of electrons in the first spin, a flow of electrons in the second spin, and a spin current are represented as $J_\uparrow$, $J_\downarrow$, and $J_S$, respectively, $J_S=J_\uparrow-J_\downarrow$ is defined. $J_S$ is a flow of electrons with polarizability of 100%. In other words, in the spin-orbit torque wiring, a current as a net flow of charges is zero and a spin current which does not involve such a current is particularly called a pure spin current.

When a spin-orbit torque wiring in which a pure spin current is generated is joined to the magnetic domain wall drive layer 3, spins oriented in a predetermined direction are diffused and flows into the magnetic domain wall drive layer 3.

An interface Rashba effect refers to a phenomenon in which spins are easily oriented in a predetermined direction by receiving an influence of an interface between different elements and the spins oriented in the predetermined direction are accumulated near the interface.

For example, in FIG. 7, the interface between the spin-orbit torque wiring and the magnetic domain wall drive layer 3 corresponds to the interface between the different elements. For this reason, spins oriented in a predetermined direction are accumulated on a surface of the spin-orbit torque wiring on the magnetic domain wall drive layer 3 side. The accumulated spins are diffused and flow into the magnetic domain wall drive layer 3 to obtain stable energy.

A direction of the spins diffused and flowing into the magnetic domain wall drive layer 3 can be changed to a direction of a current flowing through the first spin-orbit torque wiring 24 and the second spin-orbit torque wiring 25. Setting is performed so that spins of a direction that is the same as that of the magnetization $M_{3a}$ and spins of a direction that is the same as that of the magnetization M3b are supplied to a first area 3a of the magnetic domain wall drive layer 3 and a second area 3b of the magnetic domain wall drive layer 3, respectively.

In this way, spins in a predetermined direction can be supplied to the magnetic domain wall drive layer 3 by causing the currents $I_{24}$ and $I_{25}$ to flow to at least one of the first spin-orbit torque wiring 24 and the second spin-orbit torque wiring 25. As a result, a proportion of the constitution between the first area 3a and the second area 3b of the magnetic domain wall drive layer 3 is changed and a position of the magnetic domain wall DW is moved so that data can be recorded with multiple values.

At the time of reading data, like in the magnetic domain wall type analog memory element 100 according to the first embodiment, a flow direction of a current is controlled between the magnetization fixed layer 1 and the second area 3b of the magnetic domain wall drive layer 3 so that data can be correctly read.

A spin-orbit torque wiring is made of a material in which a pure spin current is generated based on a spin Hall effect when a current flows therethrough. A material constituting a spin-orbit torque wiring is not limited to a material consisting of a single element and may be a material constituted of a portion composed of a material in which a pure spin current is generated and a portion composed of a material in which a pure spin current is not generated, or the like.

A spin-orbit torque wiring may include a nonmagnetic heavy metal. Here, a heavy metal is used to mean a metal with a specific gravity equal to or higher than that of yttrium. A spin-orbit torque wiring may consist only of a nonmagnetic heavy metal.

In this case, a nonmagnetic heavy metal is preferably a nonmagnetic metal having a large atomic number of 39 or more and having d electrons or f electrons in the outermost shell. This is because such a nonmagnetic heavy metal has a large spin-orbit interaction in which a spin Hall effect is caused. A spin-orbit torque wiring may consist only of a nonmagnetic metal having a large atomic number of 39 or more and having d electrons and f electrons in the outermost shell.

Normally, when a current is caused to flow through a metal, all electrons move in a direction opposite to that of the current irrespective of a direction of a spin thereof, whereas, in a nonmagnetic metal having a large atomic number and having d electrons and f electrons in the outermost shell, a direction in which electrons move based on a spin Hall effect depends on a direction of a spin of the electrons because the spin-orbit interaction thereof is large and a pure spin current tends to be easily generated. Furthermore, it is desirable that a spin-orbit torque wiring be made of a metallic alloy. Since an alloy contains different metallic elements in one structure, symmetry of a crystal structure decreases and a pure spin current tends to be easily generated. Furthermore, it is further desirable that atomic numbers of metallic elements constituting an alloy be sufficiently different. In this case, since orbits of metallic elements that electrons feel change largely, a pure spin current tends to be generated more easily.

Also, a spin-orbit torque wiring may include a magnetic metal. A magnetic metal refers to a ferromagnetic metal or an antiferromagnetic metal. This is because, when a nonmagnetic metal contains a trace amount of magnetic metal, a spin-orbit interaction can be enhanced and a spin current generation efficiency with respect to a current flowing through a spin-orbit torque wiring can be increased. A spin-orbit torque wiring may consist only of an antiferromagnetic metal.

Since a spin-orbit interaction is caused due to an inherent material in-field of a spin-orbit torque wiring material, a pure spin current is generated even in a nonmagnetic material. When a trace amount of magnetic metal is added to a spin-orbit torque wiring material, a spin current generation efficiency is improved because the magnetic metal itself scatters flowing electron spins. Here, since the generated pure spin current is scattered by the added magnetic metal when an amount of addition of a magnetic metal is excessively increased, an action of decreasing a spin current accordingly becomes stronger. Therefore, it is desirable that a molar ratio of the added magnetic metal be sufficiently smaller than a molar ratio of a main component of the spin-orbit torque wiring. For example, a molar ratio of the added magnetic metal is preferably 3% or less.

Also, a spin-orbit torque wiring may include a topological insulator. A spin-orbit torque wiring may consist only of a topological insulator. A topological insulator is a material in which the interior of the material is an insulator or a high resistance material, but is a material in which a spin-polarized metallic state is generated on a surface thereof. As such a material, there are materials having an internal magnetic field called a spin-orbit interaction. Thus, a new topological phase appears due to an effect of a spin-orbit interaction even if there is no external magnetic field. This is a topological insulator and a pure spin current can be generated with high efficiency due to a strong spin-orbit interaction and breaking of inversion symmetry at an edge.

Preferable examples of such a topological insulator include SnTe, $Bi_{1.5}Sb_{0.5}Te_{1.7}Se_{1.3}$, $TlBiSe_2$, $Bi_2Te_3$, $(Bi_{1-x}Sb_x)_2Te_3$ and the like. Such topological insulators can generate a spin current with high efficiency.

Fourth Embodiment

Figure 8:
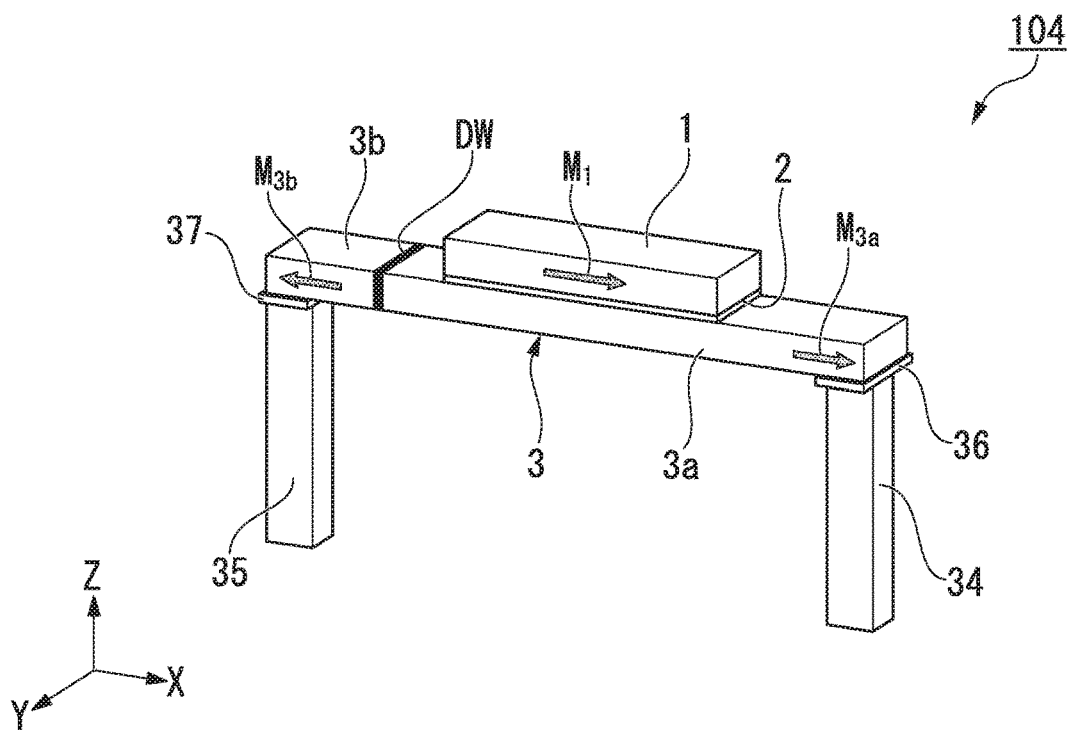
FIG. 8 is a schematic perspective view showing a magnetic domain wall type analog memory element according to a fourth embodiment.

FIG. 8 is a schematic perspective view showing a magnetic domain wall type analog memory element 104 according to a fourth embodiment. The magnetic domain wall type analog memory element 104 according to the fourth embodiment and the magnetic domain wall type analog memory element 100 according to the first embodiment differ in that the magnetic domain wall type analog memory element 104 according to the fourth embodiment includes different magnetization suppliers. Other constitutions of the magnetic domain wall type analog memory element 104 according to the fourth embodiment are the same as those of the magnetic domain wall type analog memory element 100 according to the first embodiment and constituent elements of the magnetic domain wall type analog memory element 104 according to the fourth embodiment that are the same as those of the magnetic domain wall type analog memory element 100 according to the first embodiment will be denoted with the same reference numerals.

In the magnetic domain wall type analog memory element 104 according to the fourth embodiment, the magnetization suppliers are a first voltage application terminal 34 and a second voltage application terminal 35 connected to a magnetic domain wall drive layer 3 with insulating layers 36 and 37 therebetween. Hereinafter, the first voltage application terminal 34 and the second voltage application terminal 35 are collectively referred to as a voltage application terminal in some cases.

Since the magnetization suppliers of the magnetic domain wall type analog memory element 104 according to the fourth embodiment are different from those of the magnetic domain wall type analog memory element 100 according to the first embodiment, an operation at the time of writing is different. When writing is performed on the magnetic domain wall type analog memory element 104, a voltage is applied between a magnetization fixed layer 1 and the first voltage application terminal 34 or the second voltage application terminal 35.

For example, when a voltage is applied between the magnetization fixed layer 1 and the first voltage application terminal 34, a part of a magnetization $M_{3a}$ of a first area 3a is affected by such a voltage. When such a voltage is applied with a pulse, a part of the magnetization $M_{3a}$ is oriented in the Z direction at the time of applying such a voltage and is oriented in an easy magnetization direction+X direction or easy magnetization direction−X direction at a timing at which the voltage application is stopped. Whether the magnetization oriented in the Z direction falls in the +X direction or the −X direction has an equal probability, and an orientation of a part of the magnetization $M_{3a}$ can be changed from the +X direction to the −X direction by adjusting a timing, the number of times, and a period at which a pulse voltage is applied.

In this way, a voltage is applied to the magnetic domain wall drive layer 3 with a pulse so that spins in a predetermined direction can be supplied to the magnetic domain wall drive layer 3. As a result, a proportion of the constitution between the first area 3a and the second area 3b of the magnetic domain wall drive layer 3 is changed and a position of a magnetic domain wall DW is moved so that data can be recorded with multiple values.

Figure 9:
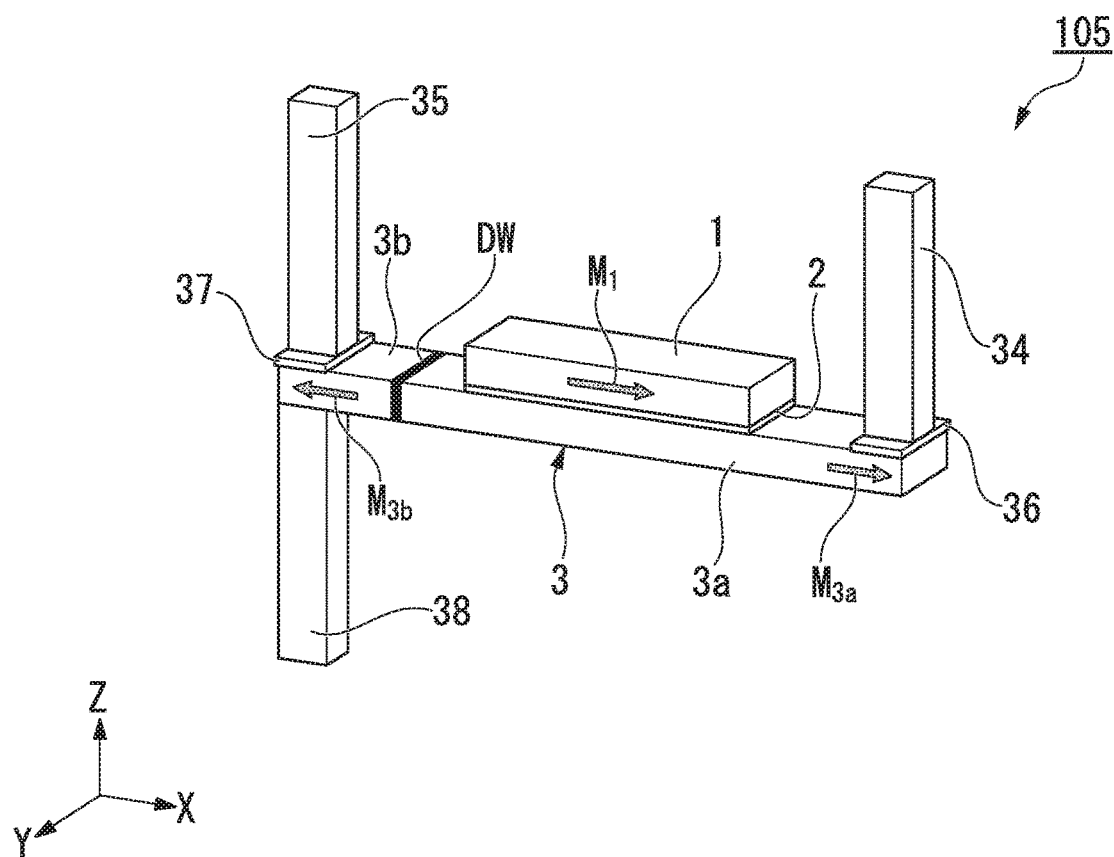
FIG. 9 is a schematic perspective view illustrating another example of the magnetic domain wall type analog memory element according to the fourth embodiment.

On the other hand, the insulating layers 36 and 37 impede a flow of a current at the time of reading-in. For this reason, there is a concern concerning reduction of output characteristics of the magnetic domain wall type analog memory element 104 due to the presence of the insulating layers 36 and 37. In this case, like in the magnetic domain wall type analog memory element 104 illustrated in FIG. 9, a reading wiring 38 through which a read current flows may be provided.

Although the embodiments of the present invention have been described in detail above with reference to the drawings, the constitutions in the embodiments, the combinations thereof, and the like are merely examples and addition, omissions, substitutions, and other changes of the constitutions are possible without departing from the gist of the present invention.

In the magnetization suppliers, the magnetization supplier for the first area 3a and the magnetization supplier for the second area 3b may be different. For example, the magnetization supplier for the first area 3a may be the first magnetization supply layer 4 and the magnetization supplier for the second area 3b may be the second wiring 15. In this way, the magnetization suppliers according to the first to fourth embodiments may be combined and arranged. Furthermore, as one of the magnetization suppliers, a write current itself flowing through the magnetic domain wall drive layer 3 may be adopted as a spin polarization current.

(Magnetic Domain Wall Type Analog Memory)

The magnetic domain wall type analog memory according to the embodiment includes a plurality of magnetic domain wall type analog memory elements according to the above-described embodiments.

Figure 10:
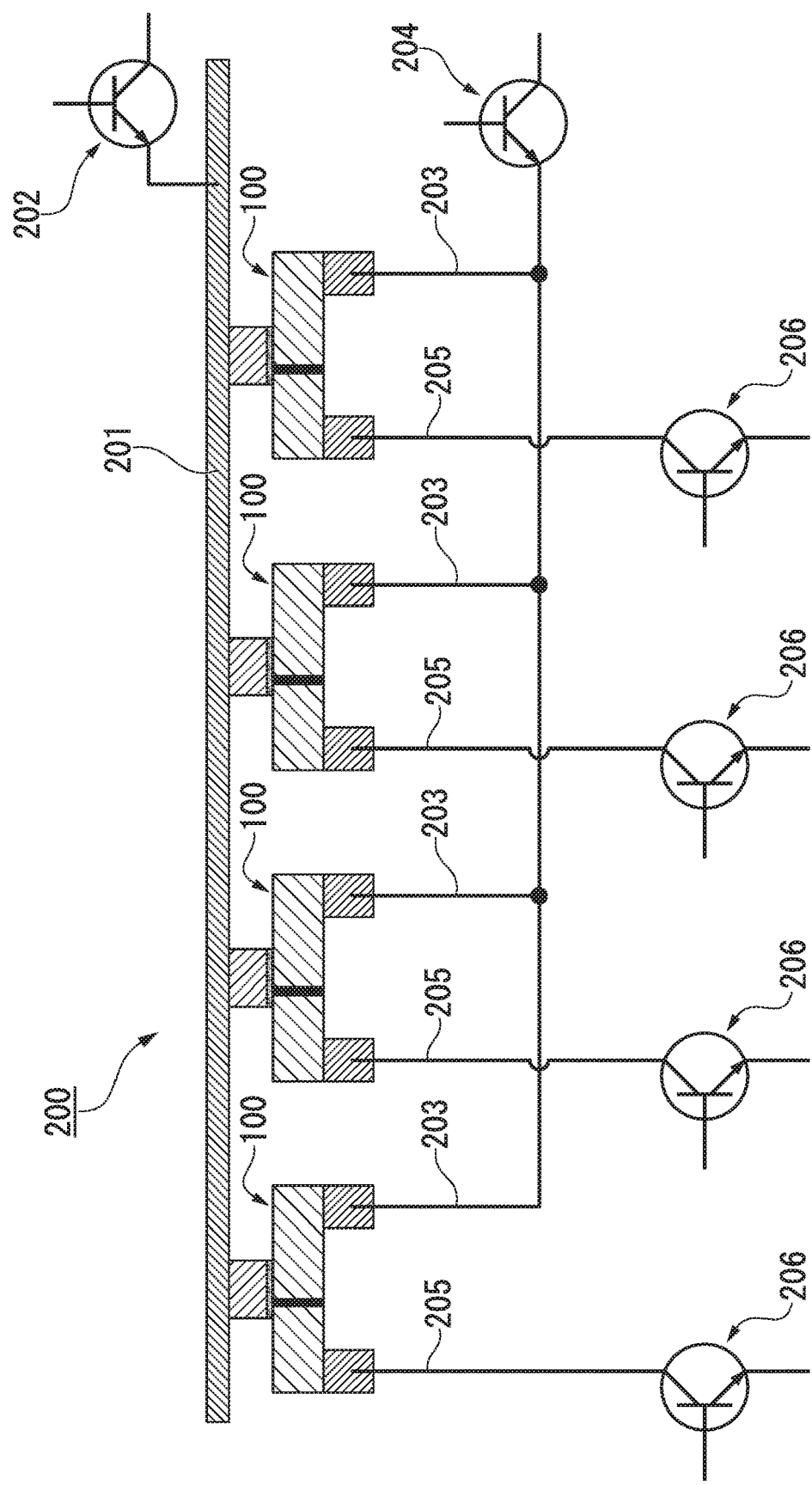
FIG. 10 is a diagram schematically illustrating an example of a circuit structure of the magnetic domain wall type analog memory according to the embodiment.

FIG. 10 is a diagram schematically illustrating an example of a circuit structure of a magnetic domain wall type analog memory 200 according to the embodiment. The magnetic domain wall type analog memory 200 includes a plurality of magnetic domain wall type analog memory element 100, a first wiring 201, a first control element 202, a second wiring 203, a second control element 204, a third wiring 205, and a cell selection control element 206.

The first wiring 201 is connected to a magnetization fixed layer 1 of each of the magnetic domain wall type analog memory elements 100 and connects the magnetization fixed layer 1 to the first control element 202. The second wiring 203 is connected to a first magnetization supply layer 4 of each of the magnetic domain wall type analog memory elements 100 and connects the first magnetization supply layer 4 to the second control element 204. The third wiring 205 is connected to a second magnetization supply layer 5 of each of the magnetic domain wall type analog memory elements 100 and connects the first magnetization supply layer 4 and the cell selection control element 206.

Material used as materials of normal wirings can be used for the first wiring 201, the second wiring 203, and the third wiring 205. For example, aluminum, silver, copper, gold, or the like can be used.

The first control element 202 controls a current flowing through the first wiring 201. The second control element 204 controls a current flowing through the second wiring 203. The cell selection control element 206 performs control to select a magnetic domain wall type analog memory element 100 to which a current flows at the time of writing or reading among the magnetic domain wall type analog memory elements 100.

Known switching elements can be used for the first control element 202, the second control element 204, and the cell selection control element 206. For example, transistor elements represented by field-effect transistors or the like can be used.

When data is written to the magnetic domain wall type analog memory 200, the cell selection control element 206 connected to the second control element 204 and the magnetic domain wall type analog memory element 100 in which the data is desired to be written is opened. Thus, a predetermined magnetic domain wall DW of the magnetic domain wall drive layer 3 of the magnetic domain wall type analog memory element 100 is moved and data is written.

When data is read from the magnetic domain wall type analog memory 200, the cell selection control element 206 connected to the first control element 202 and the magnetic domain wall type analog memory element 100 in which the data is desired to be written is opened. Thus, desired data of the magnetic domain wall type analog memory element 100 is read.

(Nonvolatile Logic Circuit)

In a nonvolatile logic circuit according to the embodiment, the magnetic domain wall type analog memory elements according to the embodiment are arranged in an array fashion, a spin-transfer torque magnetoresistive random-access memory (STT-MRAM) is provided in or outside the array, a storage function and a logical function are provided, and the magnetic domain wall type analog memory element and the STT-MRAM are provided for the storage function.

Since the magnetic domain wall type analog memory element and the STT-MRAM can be prepared using the same process, manufacturing costs can be reduced. Furthermore, a digital STT-MRAM and a magnetic domain wall type analog memory element arranged in an array fashion are arranged in the same circuit so that a logic whose input/output is digitized and in which data can be processed therein in an analog manner can be formed.

(Magnetic Neuro-Element)

Figure 11:
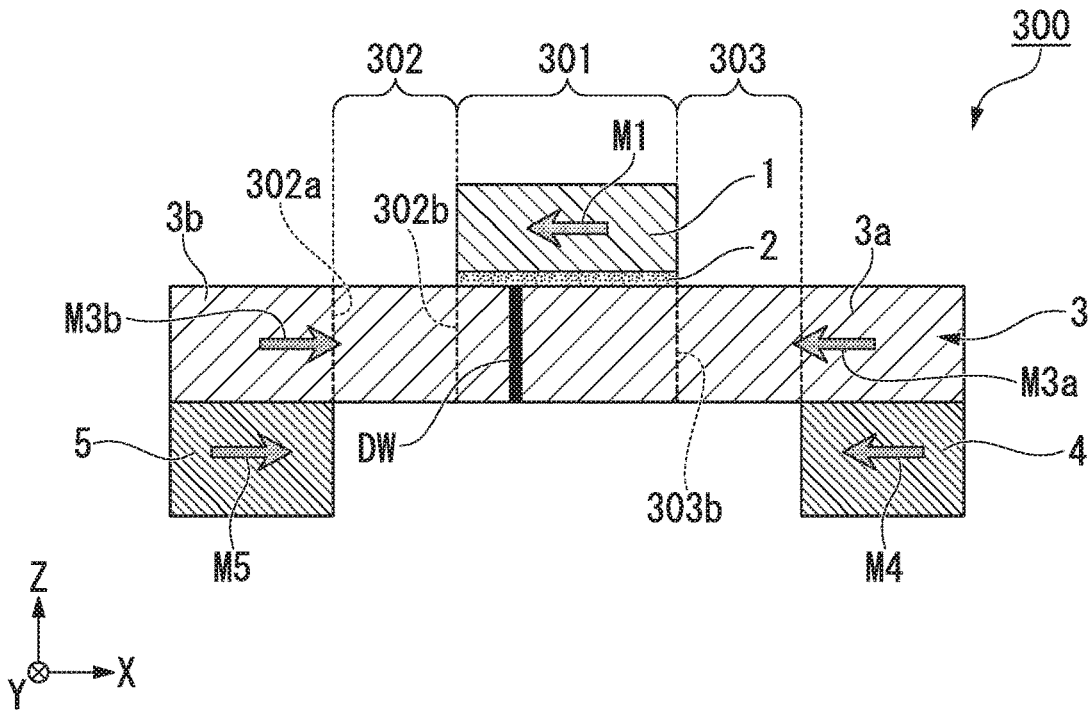
FIG. 11 is a cross-sectional schematic diagram illustrating an example of a magnetic neuro-element according to the embodiment.

FIG. 11 is a cross-sectional schematic diagram illustrating an example of a magnetic neuro-element according to the embodiment. A magnetic neuro-element 300 according to the embodiment includes the above-described magnetic domain wall type analog memory element and a current source (not shown) including a control circuit. There are a first storage 301 and a second storage 302 and a third storage 303 configured to sandwich the first storage 301 in a longitudinal direction of the magnetic domain wall drive layer 3 of the magnetic domain wall type analog memory element. The control circuit performs control to flow a write current capable of sequentially moving a magnetic domain wall such that the magnetic domain wall stays at least once in each of the first storage 301, the second storage 302, and the third storage 303.

The first storage 301 is a portion of the magnetic domain wall drive layer 3 in which the magnetic domain wall drive layer 3 is superimposed on the magnetization fixed layer 1 in plan view. The second storage 302 is a portion of the magnetic domain wall drive layer 3 between portions in which the magnetic domain wall drive layer 3 is superimposed on the magnetization fixed layer 1 and the second magnetization supply layer 5 in plan view (portion of the magnetic domain wall drive layer 3 which is superimposed on neither the magnetization fixed layer 1 nor the second magnetization supply layer 5). Furthermore, the third storage 303 is a portion between the magnetization fixed layer 1 and the first magnetization supply layer 4 in plan view (portion which is not superimposed on both of the magnetization fixed layer 1 and the first magnetization supply layer 4).

A magnetic neuro-element is an element configured to simulate a synapse operation and can be used as a magnetic neuro-element by providing the control circuit to the magnetic domain wall type analog memory element according to the embodiment.

A synapse has a linear output with respect to external stimulus and reversibly outputs without a hysteresis when subjecting to a reverse load. When an area of a portion in which magnetization directions of the magnetization fixed layer 1 and the magnetic domain wall drive layer 3 are parallel is continuously changed due to driving (movement) of the magnetic domain wall DW, a parallel circuit is formed using the current path formed in the portion in which the magnetization directions of the magnetization fixed layer 1 and the magnetic domain wall drive layer 3 are parallel a current path formed in a portion with a current path antiparallel to that of the above current path.

When the magnetic domain wall DW of the magnetic domain wall drive layer 3 is moved, a ratio between an area ratio of the portion in which the magnetization directions are parallel and an area ratio of the portion in which the magnetization directions are antiparallel is changed and a relatively linear resistance change can be obtained. Furthermore, the movement of the magnetic domain wall DW depends on a magnitude of a current and a time of a current pulse to be applied. For this reason, a magnitude and a direction of a current and time of a current pulse to be applied can be regarded as external loads.

(Initial Storage Stage)

For example, when the magnetic domain wall of the magnetic domain wall drive layer 3 is maximally moved in the −X direction, the magnetic domain wall DW is stabilized at an end 302a of the second magnetization supply layer 5 on the magnetization fixed layer 1 side. When a current is caused to flow from the first magnetization supply layer 4 to the second magnetization supply layer 5, electrons flow from the second magnetization supply layer 5 to the first magnetization supply layer 4, electrons spin-polarized in the second magnetization supply layer 5 and the magnetic domain wall drive layer 3 cause a spin transfer, and the magnetic domain wall DW is moved in the +X direction. Read resistance does not change before the magnetic domain wall DW reaches an end 302b of the magnetization fixed layer 1 on the second magnetization supply layer 5 side even when the magnetic domain wall DW is moved. This state (case in which the magnetic domain wall DW is arranged in the second storage 302) is referred to as an initial storage state. This state is a state in which recording as data is not performed in the initial storage state, but preparation for recording data is in place.

(Main Storage Stage)

Resistance at the time of reading changes while the magnetic domain wall DW passes under the magnetization fixed layer 1 (portion in which the magnetization fixed layer 1 is superimposed on the magnetic domain wall drive layer 3; the first storage 301). A current flowing from the first magnetization supply layer 4 to the second magnetization supply layer 5 is set to an external load so that a linear resistance change proportional to the load to some extent can be read. This is a main storage stage. In other words, a case in which the magnetic domain wall DW is arranged in the first storage 301 is referred to as a main storage stage at a storage stage. A state in which the magnetic domain wall DW is further outward from one end of the magnetization fixed layer 1 in the X direction is defined as a storage state or a non-storage state and a state in which the magnetic domain wall DW is further outward from the other end of the magnetization fixed layer 1 is defined as a non-storage state or a storage state. When a direction of a current flowing through the magnetic domain wall drive layer 3 is reversed, an opposite action is obtained.

(Depth Storage Stage)

When the magnetic domain wall DW reaches an end 303b of the magnetization fixed layer 1 on the first magnetization supply layer 4 side and the magnetic domain wall DW is moved in a direction in which magnetic domain wall DW is away from the magnetization fixed layer 1, a read-in output does not change. However, after the magnetic domain wall DW is sufficiently away from the magnetization fixed layer 1, an output at the time of reading-in does not change before the magnetic domain wall DW reaches the end 303b of the magnetization fixed layer 1 even when a reverse load is applied. In other words, when the magnetic domain wall DW is present in the third storage 303, a storage is not lost even when an external load is applied and a storage is deepened. In other words, a case in which the magnetic domain wall DW is arranged in the third storage 303 is referred to as a depth storage stage.

Note that, when a direction of a current flowing through the magnetic domain wall drive layer 3 is reversed, a correspondence between the initial storage stage, the main storage stage, and the depth storage stage and each storage is reversed.

In order to use the magnetic domain wall type analog memory as the magnetic neuro-element configured to simulate the synapse operation in this way, it is necessary to cause the movement of the magnetic domain wall DW to sequentially go through the initial storage stage, the main storage stage, and the depth storage stage. The movement of the magnetic domain wall DW is controlled using a current source from which a write current flows. In other words, the magnetic domain wall type analog memory functions as a magnetic neuro-element by including the current source (not shown) having the control circuit configured to perform control to flow a write current capable of sequentially moving the magnetic domain wall such that the magnetic domain wall stays at least once in at least each of the first storage, the second storage, and the third storage. The number of movements of the magnetic domain wall in which the magnetic domain wall has stayed in each of the first storage 301, the second storage 302, and the third storage 303 is determined in accordance with the conditions of the write current.

(Non-Recognizable Storage Stage)

Storage is non-recognizable by moving a magnetic domain wall of the magnetic domain wall drive layer 3 to a non-storage state. Furthermore, driving or removal of a magnetic domain wall can also be caused due to an external magnetic field, heat, and physical distortion to be applied. Since the magnetic domain wall type analog memory has an output showing a constant low or high resistance value, storage and non-storage are determined through definitions. Furthermore, when a magnetic domain wall is moved or removed through a method other than flowing a current through the magnetic domain wall drive layer 3, correlation of information between a plurality of magnetic domain wall type analog memories is lost because the result of such a process is uncertain. Such a state is referred to as a non-recognizable stage.

(Artificial Brain Using Magnetic Neuro-Element)

The magnetic neuro-element according to the embodiment is a memory capable of simulating the movement of a synapse and undergoing the initial storage stage, the main storage stage, and the depth storage stage. In other words, it is possible to simulate a brain by installing magnetic domain wall type analog memories in a plurality of circuits. It is possible to form a brain with a high degree of integration in an arrangement in which magnetic domain wall type analog memories are evenly arranged in an array fashion vertically and horizontally like in a general memory.

Figure 12:
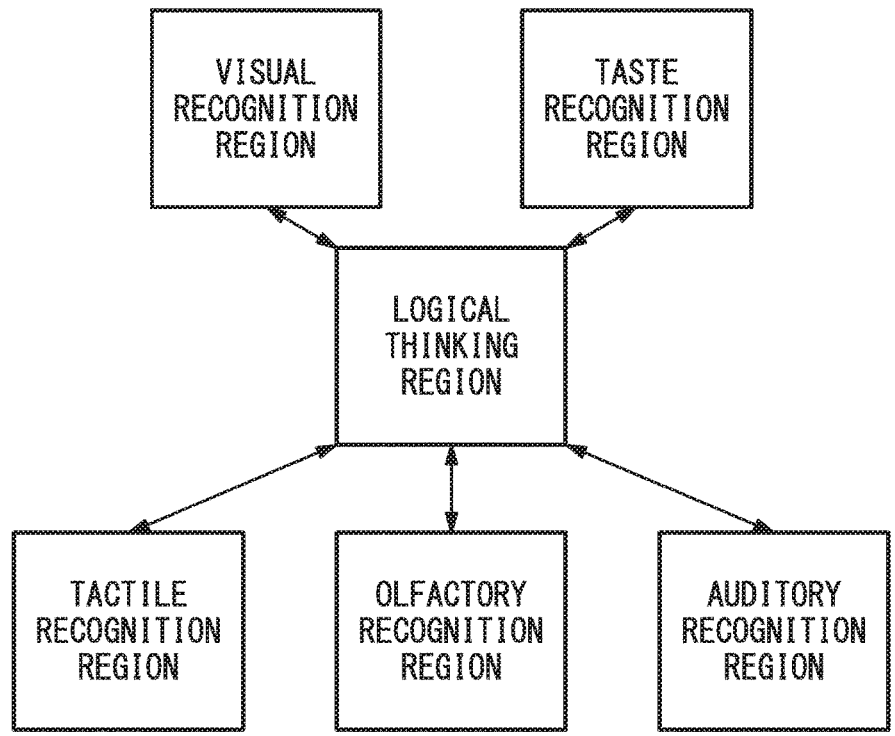
FIG. 12 is a diagram illustrating an artificial brain concept using the magnetic neuro-element according to the embodiment.
Figure 13:
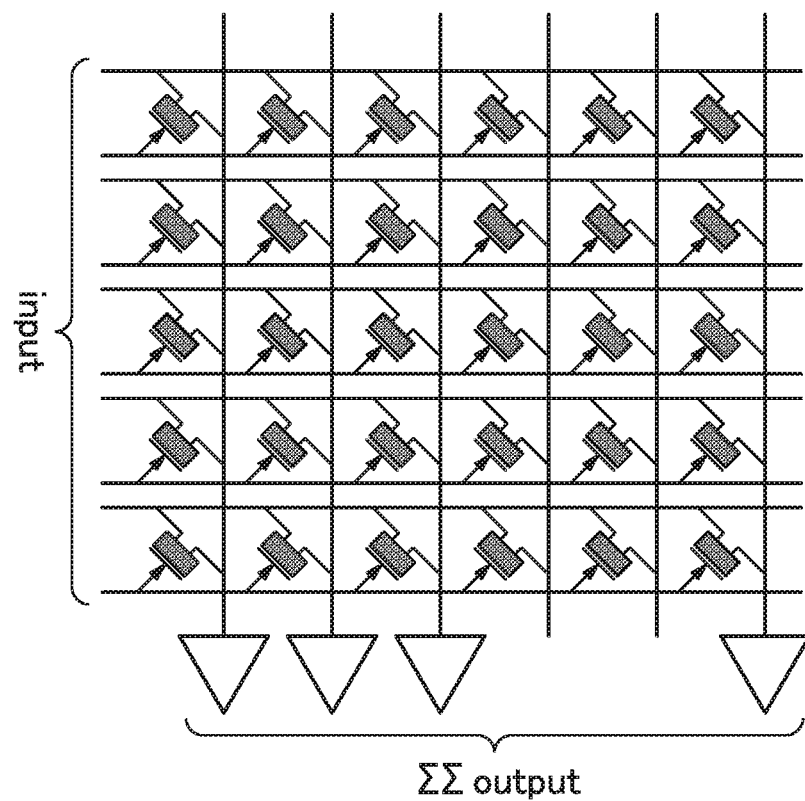
FIG. 13 is a product sum calculation circuit in which magnetic neuro-elements are arranged in an array fashion according to the embodiment.

Brains with different degrees of recognition from external loads can be formed by arraying a plurality of magnetic neuro-elements having a specific circuit using the magnetic neuro-elements as one block as illustrated in FIG. 12. FIG. 13 is a product sum calculation circuit in which magnetic neuro-elements are arranged in an array fashion. In FIG. 13, data is simultaneously input to wirings from the left direction in the drawing. The input data outputs data on the basis of a record weight of a magnetic neuro-element (the initial storage stage, the main storage stage, and the depth storage stage). Each data output from each magnetic neuro-element is bundled in a column direction and output. A neuromorphic computer including the product sum calculation circuit illustrated in FIG. 13 can produce, for example, personality such as a brain satisfactorily sensitive to color or a brain with high understanding with respect to language like a brain. In other words, a process of determining the next action can be formed by performing a recognition process on information obtained from an external sensor in five sense areas optimized for vision, taste, touch, olfaction, and auditory perceptions and determining the processed information in a logical thinking region. In addition, when a material of the magnetic domain wall drive layer 3 is changed, since a driving speed of the magnetic domain wall with respect to a load or a method for forming the magnetic domain wall is changed, an artificial brain having such a change as personality can be formed.

EXPLANATION OF REFERENCES

1 Magnetization fixed layer
2 Non-magnetic layer
3 Magnetic domain wall drive layer
3a First area
3b Second area
4 First magnetization supply layer
5 Second magnetization supply layer
14 First wiring
15 Second wiring
24 First spin-orbit torque wiring
25 Second spin-orbit torque wiring
34 First voltage application terminal
35 Second voltage application terminal
36, 37 Insulating layer
38 Reading wiring
100, 101, 102 Magnetic domain wall type analog memory element
200 Magnetic domain wall type analog memory
201 First wiring
202 First control element
203 Second wiring
204 Second control element
205 Third wiring
206 Cell selection control element
300 Magnetic neuro-element
301 First storage
302 Second storage
303 Third storage
M1, M3a, M3b, M4, M5 Magnetization
$I_{W1}$, $I_{W2}$, $I_R$, $I_{14}$, $I_{15}$, $I_{24}$, $I_{25}$ Current
$e_1$, $e_2$ Conduction electrons
$R_{3a}$, $R_{3b}$, $R_{DW}$ Resistor
DW Magnetic domain wall

What is claimed is:

1. A magnetic domain wall type analog memory, comprising:
a plurality of magnetic domain wall type analog memory elements;
a first transistor element;
a second transistor element; and
a plurality of third transistor elements as cell selection control elements,
wherein, each of the magnetic domain wall type analog memory elements comprising:
a magnetization fixed layer in which a magnetization is oriented in a first direction;
a non-magnetic layer provided on one surface of the magnetization fixed layer;
a magnetic domain wall drive layer including a first area in which a magnetization is oriented in the first direction, a second area in which a magnetization is oriented in a second direction opposite to the first direction, and a magnetic domain wall formed as an interface between the first area and the second area and provided to sandwich the non-magnetic layer between the magnetic domain wall drive layer and the magnetization fixed layer;
a current controller configured to cause a current to flow between the magnetization fixed layer and the second area at the time of reading; and
a first magnetization supplier configured to supply a magnetization oriented in the first direction to the first area in the magnetic domain wall drive layer and a second magnetization supplier configured to supply a magnetization oriented in the second direction to the second area in the magnetic domain wall drive layer,
wherein a magnetization of the first magnetization supplier is oriented in the first direction and a magnetization of the second magnetization supplier is oriented in the second direction,
wherein, a first wiring connects each of the magnetization fixed layers in the plurality of the magnetic domain wall type analog memory elements to the first transistor element,
wherein, a second wiring connects each of the first magnetization suppliers in the plurality of magnetic domain wall type analog memory elements to the second transistor element, and
wherein, each of the second magnetization suppliers in the plurality of magnetic domain wall type analog memory elements is connected by one of a plurality of third wirings to a respective one of the plurality of third transistor elements.

2. The magnetic domain wall type analog memory element-according to claim 1,
wherein at least one of the first magnetization supplier and the second magnetization supplier is in contact with the magnetic domain wall drive layer and is a magnetization supply layer having a magnetization oriented in the first or second direction.

3. The magnetic domain wall type analog memory element-according to claim 1,
wherein at least one of the first magnetization supplier and the second magnetization supplier is electrically insulated from the magnetic domain wall drive layer and is a wiring extending in a direction in which the wiring intersects the magnetic domain wall drive layer.

4. The magnetic domain wall type analog memory according to claim 1,
wherein at least one of the first magnetization supplier and the second magnetization supplier is in contact with the magnetic domain wall drive layer and is a spin-orbit torque wiring extending in a direction in which the spin-orbit torque wiring intersects the magnetic domain wall drive layer.

5. The magnetic domain wall type analog memory element-according to claim 1,
wherein at least one of the first magnetization supplier and the second magnetization supplier is a voltage applier connected to the magnetic domain wall drive layer via an insulating layer.

6. The magnetic domain wall type analog memory according to claim 1, wherein each current controller is a potential controller configured to set a potential of the second area to be lower than a potential of the magnetization fixed layer at the time of reading.

7. The magnetic domain wall type analog memory according to claim 1, wherein each current controller is a rectifying element configured to control a flow direction of a current.

8. The magnetic domain wall type analog memory according to claim 2, wherein each current controller is a potential controller configured to set a potential of the second area to be lower than a potential of the magnetization fixed layer at the time of reading.

9. The magnetic domain wall type analog memory according to claim 3, wherein each current controller is a potential controller configured to set a potential of the second area to be lower than a potential of the magnetization fixed layer at the time of reading.

10. The magnetic domain wall type analog memory according to claim 4, wherein each current controller is a potential controller configured to set a potential of the second area to be lower than a potential of the magnetization fixed layer at the time of reading.

11. The magnetic domain wall type analog memory according to claim 5, wherein each current controller is a potential controller configured to set a potential of the second area to be lower than a potential of the magnetization fixed layer at the time of reading.

12. The magnetic domain wall type analog memory according to claim 2, wherein each current controller is a rectifying element configured to control a flow direction of a current.

13. The magnetic domain wall type analog memory according to claim 3, wherein each current controller is a rectifying element configured to control a flow direction of a current.

14. The magnetic domain wall type analog memory according to claim 4, wherein each current controller is a rectifying element configured to control a flow direction of a current.

15. The magnetic domain wall type analog memory according to claim 5, wherein each current controller is a rectifying element configured to control a flow direction of a current.

16. A magnetic domain wall type analog memory, comprising:
a plurality of magnetic domain wall type analog memory elements;
a first transistor element; and
a plurality of third transistor elements as cell selection control elements,
wherein, each of the magnetic domain wall type analog memory elements comprising:
a magnetization fixed layer in which a magnetization is oriented in a first direction;
a non-magnetic layer provided on one surface of the magnetization fixed layer;
a magnetic domain wall drive layer including a first area in which a magnetization is oriented in the first direction, a second area in which a magnetization is oriented in a second direction opposite to the first direction, and a magnetic domain wall formed as an interface between the first area and the second area and provided to sandwich the non-magnetic layer between the magnetic domain wall drive layer and the magnetization fixed layer;
a current controller configured to cause a current to flow between the magnetization fixed layer and the second area at the time of reading; and
a first magnetization supplier configured to supply a magnetization oriented in the first direction to the first area in the magnetic domain wall drive layer and a second magnetization supplier configured to supply a magnetization oriented in the second direction to the second area in the magnetic domain wall drive layer, wherein a magnetization of the first magnetization supplier is oriented in the first direction and a magnetization of the second magnetization supplier is oriented in the second direction, wherein, a first wiring connects each of the magnetization fixed layers in plurality of the magnetic domain wall type analog memory elements to the first transistor element, and wherein, each of the second magnetization suppliers in the plurality of magnetic domain wall type analog memory elements is connected to one of a plurality of third wirings to a respective one of the plurality of third transistor elements.

17. A magnetic domain wall type analog memory, comprising:
   a plurality of magnetic domain wall type analog memory elements;
   a second transistor element; and
   a plurality of third transistor elements as cell selection control elements,
   wherein, each of the magnetic domain wall type analog memory elements comprising:
      a magnetization fixed layer in which a magnetization is oriented in a first direction;
      a non-magnetic layer provided on one surface of the magnetization fixed layer;
      a magnetic domain wall drive layer including a first area in which a magnetization is oriented in the first direction, a second area in which a magnetization is oriented in a second direction opposite to the first direction, and a magnetic domain wall formed as an interface between the first area and the second area and provided to sandwich the non-magnetic layer between the magnetic domain wall drive layer and the magnetization fixed layer;
   a current controller configured to cause a current to flow between the magnetization fixed layer and the second area at the time of reading; and
   a first magnetization supplier configured to supply a magnetization oriented in the first direction to the first area in the magnetic domain wall drive layer and a second magnetization supplier configured to supply a magnetization oriented in the second direction to the second area in the magnetic domain wall drive layer, wherein a magnetization of the first magnetization supplier is oriented in the first direction and a magnetization of the second magnetization supplier is oriented in the second direction, wherein, a second wiring connects each of the first magnetization suppliers in the plurality of magnetic domain wall type analog memory elements to the second transistor element, and wherein, each of the second magnetization suppliers in the plurality of magnetic domain wall type analog memory elements is connected by one of a plurality of third wirings to a respective one of the plurality of third transistor elements.

* * * * *